(12) United States Patent
Sellinger et al.

(10) Patent No.: US 9,837,624 B2
(45) Date of Patent: Dec. 5, 2017

(54) TAILORING THE OPTICAL GAP AND ABSORPTION STRENGTH OF SILICON QUANTUM DOTS BY SURFACE MODIFICATION WITH CONJUGATED ORGANIC MOIETIES

(71) Applicant: Colorado School of Mines, Golden, CO (US)

(72) Inventors: Alan Sellinger, Golden, CO (US); Mark Lusk, Golden, CO (US); Tianlei Zhou, Golden, CO (US); Huashan Li, Golden, CO (US)

(73) Assignee: Colorado School of Mines, Golden, CO (US)

( * ) Notice: Subject to any disclaimer, the term of this patent is extended or adjusted under 35 U.S.C. 154(b) by 2 days.

(21) Appl. No.: 14/639,868

(22) Filed: Mar. 5, 2015

(65) Prior Publication Data

US 2015/0311289 A1    Oct. 29, 2015

Related U.S. Application Data

(60) Provisional application No. 61/948,339, filed on Mar. 5, 2014.

(51) Int. Cl.
*H01L 29/12* (2006.01)
*H01L 51/00* (2006.01)
*H01L 51/05* (2006.01)

(52) U.S. Cl.
CPC ...... *H01L 51/0094* (2013.01); *H01L 51/0558* (2013.01)

(58) Field of Classification Search
CPC ..... H01L 29/122; H01L 29/34; H01L 21/306; H01L 51/0094; H01L 51/0558
USPC .......................................................... 257/14
See application file for complete search history.

(56) References Cited

U.S. PATENT DOCUMENTS

| | | | | |
|---|---|---|---|---|
| 7,442,320 | B2 * | 10/2008 | Lee | H01L 31/03529 136/256 |
| 2003/0066998 | A1 * | 4/2003 | Lee | B82Y 10/00 257/19 |
| 2004/0075381 | A1 * | 4/2004 | Burroughes | H01L 51/0039 313/504 |
| 2008/0035197 | A1 * | 2/2008 | Poplavskyy | H01L 31/028 136/252 |
| 2010/0113813 | A1 * | 5/2010 | Pickett | B82Y 30/00 556/9 |
| 2010/0198521 | A1 * | 8/2010 | Haick | B82Y 15/00 702/19 |
| 2014/0339499 | A1 * | 11/2014 | Tu | C09K 11/02 257/13 |

* cited by examiner

*Primary Examiner* — Christine Enad
(74) *Attorney, Agent, or Firm* — Sheridan Ross P.C.

(57) ABSTRACT

The present invention relates to semiconductor materials that include a silicon-based quantum dot; and a conjugated organic ligand connected to the silicon-based quantum dot to obtain a functionalized quantum dot. An additional aspect of the present invention is to provide methods that include providing a silicon-based quantum dot; and connecting a conjugated organic ligand connected to the silicon-based quantum dot to obtain a functionalized quantum dot.

20 Claims, 15 Drawing Sheets

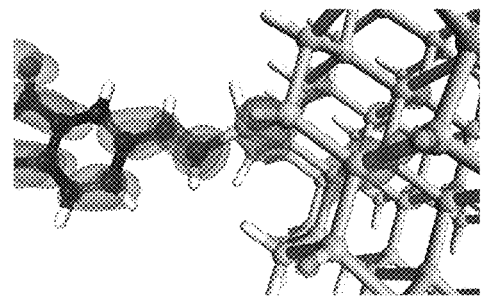
Fig. 1
Fig. 2 (a)
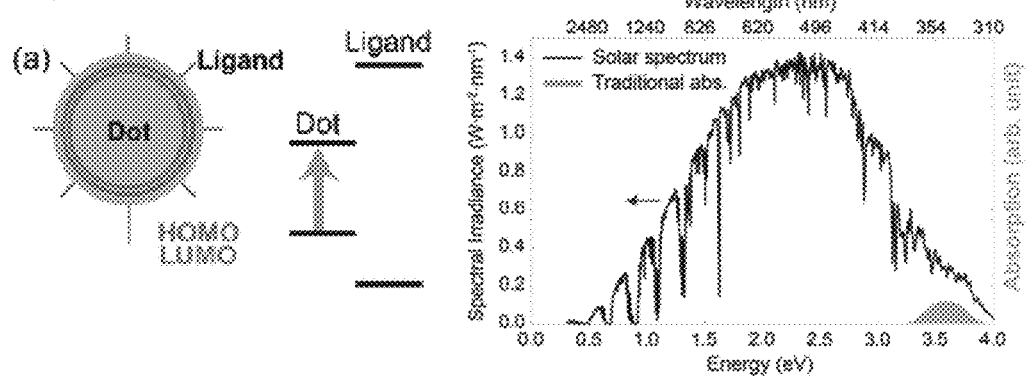
Fig. 2 (b)
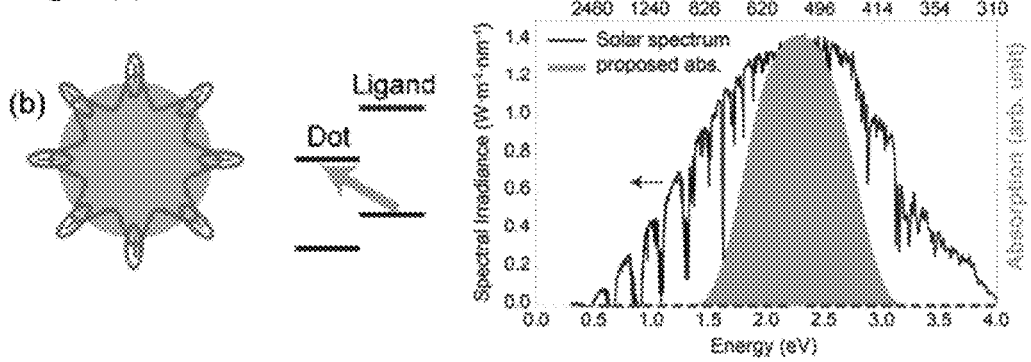

Fig. 15(a)
Fig. 15(b)
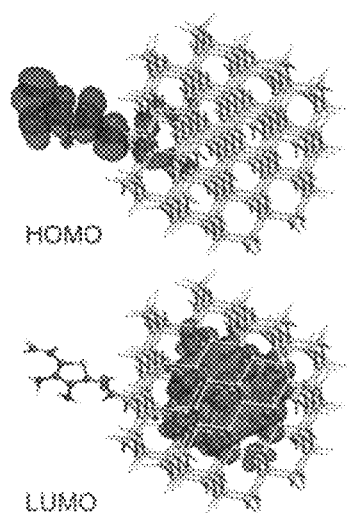
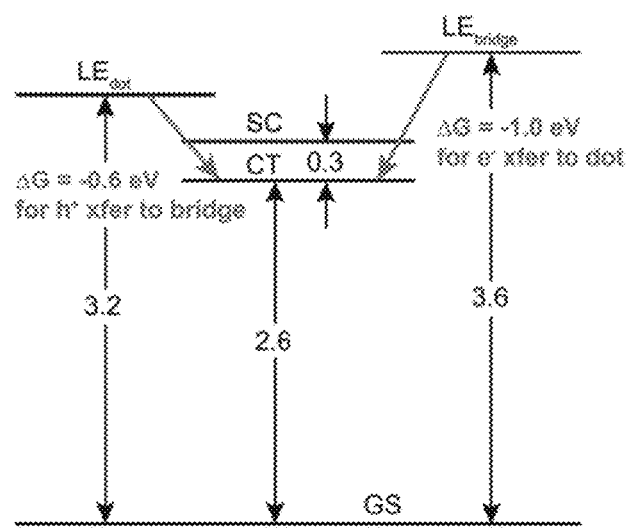
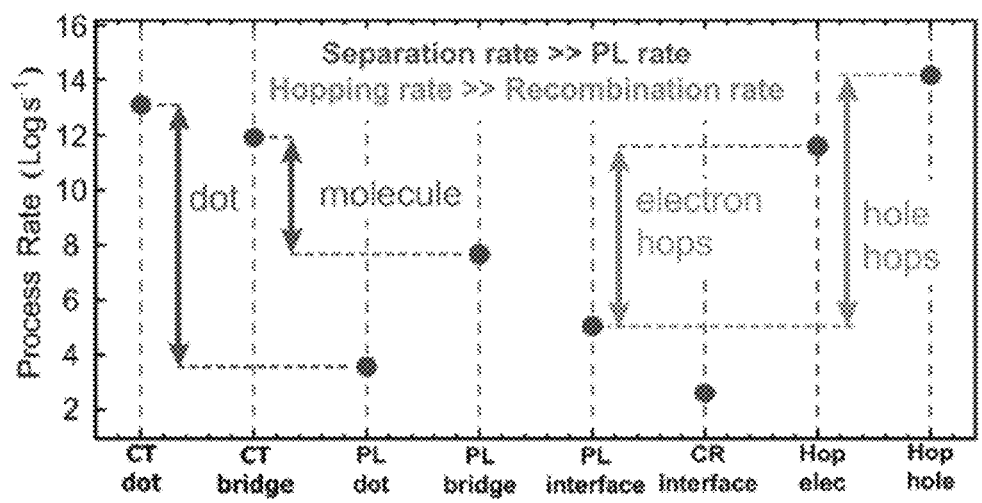
Fig. 16

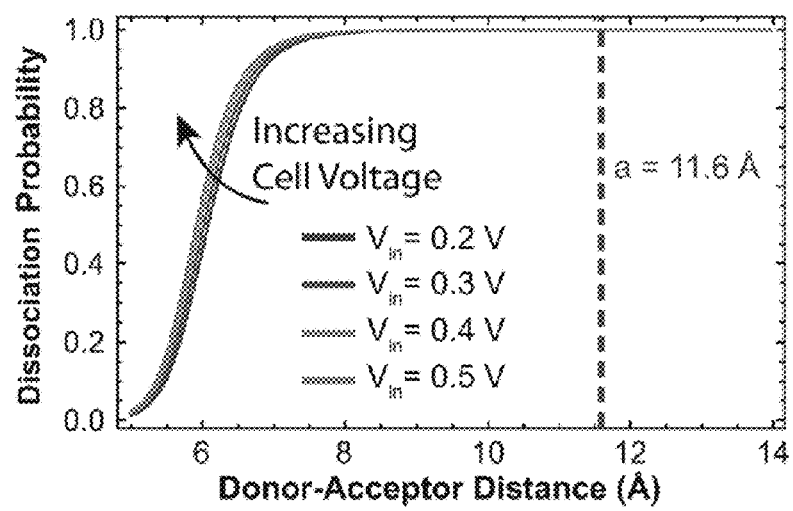
Fig. 17
Fig. 18(a)  Fig. 18(b)
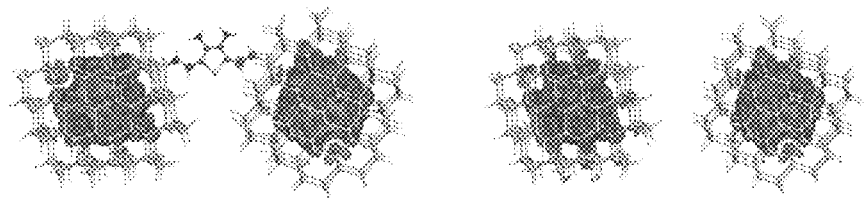
Fig. 18(c)  Fig. 18(d)
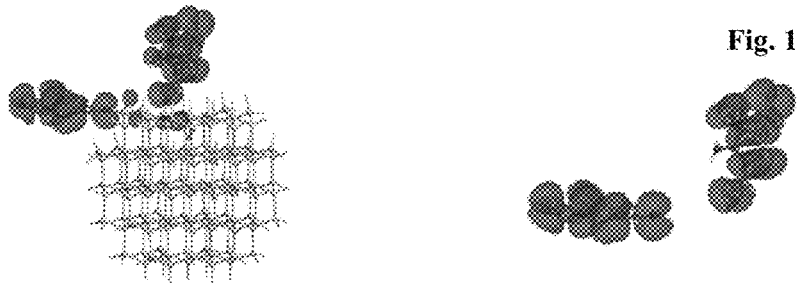

Fig. 19(a)
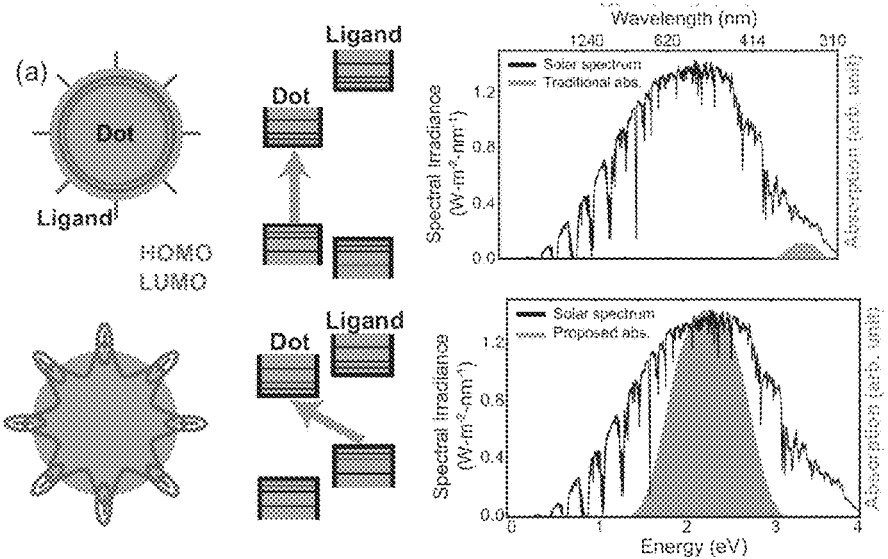
Fig. 19(b)
Fig. 20(a)
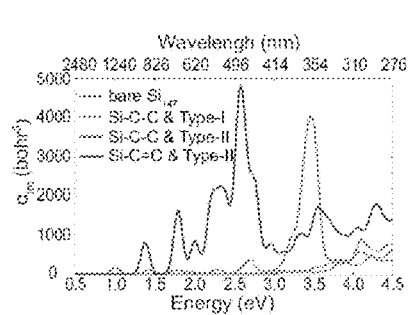
Fig. 20(b) Fig. 20(c) Fig. 20(f)
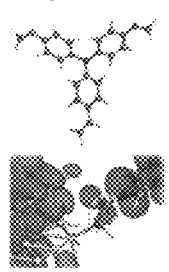 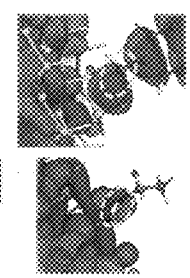 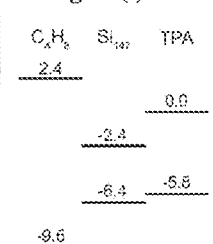
Fig. 20(d) Fig. 20(e)

Fig. 22(a)
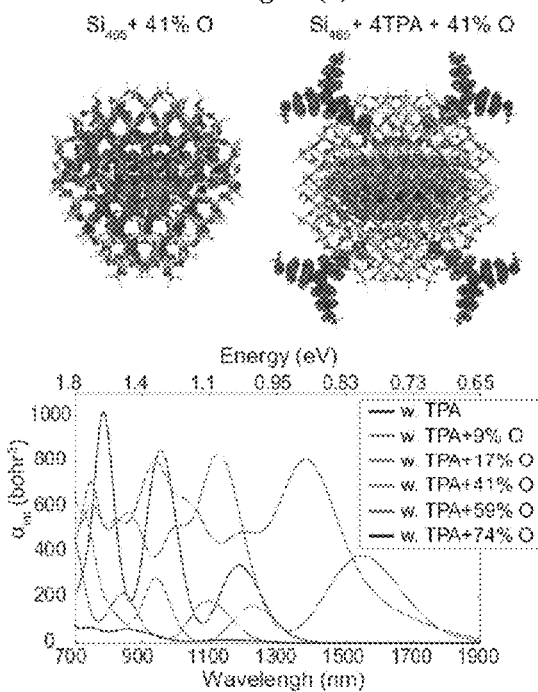
Fig. 22(b)
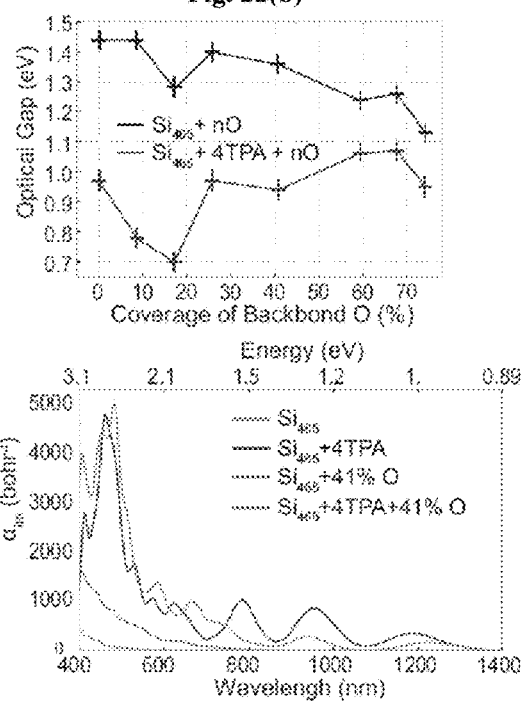
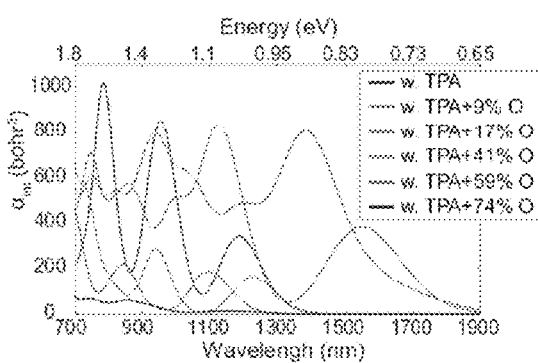
Fig. 22(c)
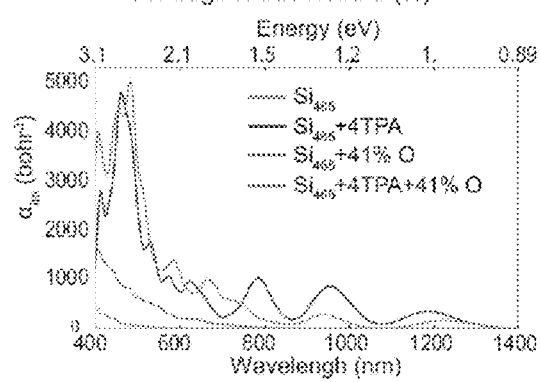
Fig. 22(d)

TAILORING THE OPTICAL GAP AND ABSORPTION STRENGTH OF SILICON QUANTUM DOTS BY SURFACE MODIFICATION WITH CONJUGATED ORGANIC MOIETIES

CROSS REFERENCE TO RELATED APPLICATIONS

This application claims the benefit of U.S. Provisional Patent Application No. 61/948,339 entitled "Tailoring the Optical Gap and Absorption Strength of Silicon Quantum Dots by Surface Modification with Conjugated Organic Moieties" filed on Mar. 6, 2014, the entire disclosure of which is incorporated by reference herein.

FIELD OF THE INVENTION

The present invention relates generally to quantum dots, and more specifically to silicon quantum dots with organic modification and methods to produce the same.

BACKGROUND OF THE INVENTION

A quantum dot ("QD") is a nanocrystal made of semiconductor materials that are small enough to exhibit quantum mechanical properties. Specifically, excitons of quantum dots are confined in all three spatial dimensions. Quantum dots, including colloidal semiconductor quantum dots in particular, have received attention for applications in light emission, photovoltaics, and biomedical imaging, sensing and treatment because of their unique properties.

SUMMARY OF THE INVENTION

Colloidal semiconductor quantum dots have useful properties that include: tunable absorption and emission spectra, solution processability, multiple exciton generation, and slow cooling rate of hot carriers. Most of the quantum dots currently explored, though, are based on metal chalcogenide semiconductors that use toxic elements such as cadmium and/or lead, which is problematic for many applications.

Silicon-based QDs (SiQDs) are advantageously less toxic; however, in spite of developments in the synthesis, processing and purification of SiQDs, challenges remain. Such challenges include: dangling bond defects that tend have a deleterious effect on the optical performance of SiQDs; a tendency of the dots to agglomerate in solution; and poor carrier mobility of assemblies of SiQDs. Also, dot designs must contend with the fact that the band edge absorption of bulk silicon is low because of its indirect character. Thus, there is a need for improved quantum dots.

The present invention relates generally to quantum dots, and more specifically to silicon quantum dots with organic modification and methods to produce the same. Various embodiments of the present disclosure describe advantageously modified SiQDs and advantageous methods of creating the modified SiQDs. For example, hybrid SiQDs are created with a special type of organic surface functionalization where conjugated vinyl connectivity between the SiQD and an organic surface ligand results in orbital redistributions that can have an advantageous impact on optical and electronic properties.

Embodiments of the present invention advantageously provide hybrid SiQDs with a special type of organic surface functionalization. For example, conjugated vinyl connectivity between the SiQD and the organic surface ligand results in orbital redistributions that can have an advantageous impact on optical and electronic properties. Also provided is a materials genome for a new class of hybrid SiQDs functionalized with conjugated organic surface and bridging ligands.

Embodiments described herein are directed towards organically functionalized SiQDs with tailored electrooptical properties that advantageously address issues that include the manipulation of light absorption, excitons, and charge through the creation of electrically active organic/inorganic bonds. The development of such organically functionalized SiQDs with tailored electrooptical properties advantageously impacts the solar energy, and light-emitting diode (LED) and biomarker technology sectors.

Accordingly, the present disclosure has been described with some degree of particularity directed to the exemplary embodiments of the present invention. It should be appreciated though that modifications or changes may be made to the exemplary embodiments of the present invention without departing from the inventive concepts contained herein.

This Summary of the Invention is neither intended nor should it be construed as being representative of the full extent and scope of the present disclosure. The present disclosure is set forth in various levels of detail in the Summary of the Invention as well as in the attached drawings and the Detailed Description of the Invention, and no limitation as to the scope of the present disclosure is intended by either the inclusion or non-inclusion of elements, components, etc. in this Summary of the Invention. Additional aspects of the present disclosure will become more readily apparent from the Detailed Description, particularly when taken together with the drawings.

The above-described benefits, embodiments, and/or characterizations are not necessarily complete or exhaustive, and in particular, as to the patentable subject matter disclosed herein. Other benefits, embodiments, and/or characterizations of the present disclosure are possible utilizing, alone or in combination, as set forth above and/or described in the accompanying figures and/or in the description herein below. However, the Detailed Description of the Invention, the drawing figures, and the exemplary claim set forth herein, taken in conjunction with this Summary of the Invention, define the invention.

BRIEF DESCRIPTION OF THE DRAWINGS

The accompanying drawings, which are incorporated in and constitute a part of the specification, illustrate embodiments of the invention and together with the general description of the invention given above, and the detailed description of the drawings given below, serve to explain the principals of this invention.

FIG. 1 shows an illustrative conjugation;

FIG. 2(a) shows illustrative passivation schemes;

FIG. 2(b) shows illustrative passivation schemes;

FIG. 15(a) shows an illustrative HOMO and LUMO interface;

FIG. 15(b) shows illustrative energy levels;

FIG. 16 shows illustrative charge transfer, photoluminescence, charge recombination and carrier hopping rates at the dot/bridge interface;

FIG. 17 shows illustrative polaron dissociation probability;

FIGS. 18(a)-18(d) show illustrative hole hopping rate;

FIGS. 19(a)-19(b) show illustrative schematics of passivation schemes;

FIGS. 20(a)-(f) shows illustrative energy level alignments;

FIGS. 22(a)-(d) shows illustrative HOMO and LUMO wave functions.

Figure 3:
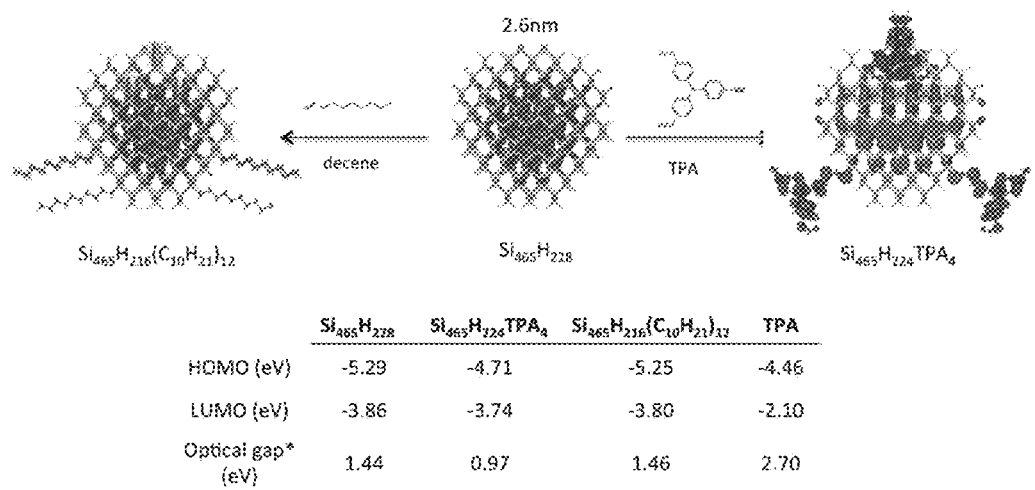
FIG. 3 shows illustrative shifting of HOMO/LUMO distributions and lowering of the band gap.

It should be understood that the drawings are not necessarily to scale. In certain instances, details that are not necessary for an understanding of the invention or that render other details difficult to perceive may have been omitted. It should be understood, of course, that the invention is not necessarily limited to the particular embodiments illustrated herein.

DETAILED DESCRIPTION

Colloidal semiconductor quantum dots (QDs) are useful for applications in light emission, photovoltaics, and biomedical imaging, sensing and treatments, because of their unique properties.

Some of these issues can be addressed by focusing on small SiQDs. Dangling bond defects can be essentially eliminated by making the dots sufficiently small, and the absorption cross-section of sufficiently small dots is dramatically enhanced via a pseudo-direct optical transition. These call for SiQDs on the order of 1-4 nm. This size regime has other advantages as well. SiQDs of this size transport excitons more efficiently, resist oxidation better, use their slice of the solar spectrum more efficiently, show greater promise in multiple-exciton generation and hot carrier collection paradigms, and have a higher excitonic coupling for the same surface-to-surface separation.

Unfortunately, SiQDs of this size have optical gaps in the range of 2-3 eV (600-400 nm) and so are poorly matched to the solar spectrum and missing the important low-optical and IR regions for light emission applications. In addition, the associated exciton binding energies are too high to result in room temperature dissociation of charge carriers for photo-electric applications. Because of their high surface-to-volume ratio, though, it may be possible to functionalize their surfaces so as to remedy these drawbacks. Surface functionalization might also be used to improve carrier mobility and processability.

Illustrative Optical Properties of Silicon Quantum Dots

There is a need to be able to engineer the optoelectronic properties of SiQDs through surface modification. FIG. 1 shows extended conjugation into vinylsilicon moiety as indicated by Density Functional Theory (DFT) analysis of functional 1.5 nm SiQD with a phenylimide surface ligand (highest occupied molecular orbital (HOMO) in red, and lowest unoccupied molecular orbital (LUMO) in green). Organic functionalization of SiQDs has been largely limited to alkyl chains that help with solubility and protection against oxidation.

One strategy is to directly generate spatially separated excitons at the Type-II interface between the core of the dot and its surface ligands. For example, FIG. 2(a) shows traditional passivation schemes with a Type-I energy level alignment between the dot and the ligand, and FIG. 2(b) shows an illustrative scheme of the present disclosure with a Type-II interface and a Si—C=C conjugating connection. As long as the coupling between the core and the terminating shell is sufficiently large, photons with energies much lower than the intrinsic band gaps of both the dot and the ligand can be absorbed to excite electrons from the HOMO (localized on the ligands) to the LUMO (localized on the dot). In fact, this concept has been applied to the core shell nanocrystals. In such a setting, Type-II architectures exhibit new absorption features in the range below the core energy gap as well as much lower charge recombination rates compared to their Type-I counterparts.

The inventors have advantageously found that connecting conjugated organic ligands to SiQDs using vinyl connectivity with proper energy level alignments results in significant orbital redistributions that can have a dramatic impact on optical properties. For instance, such orbital delocalization of electrons can be seen in the preliminary DFT analysis of FIG. 1, where the HOMO and LUMO are distributed in both the organic bridge and SiQD. Such functionalizations improve absorption cross sections but an ability to tune optical gap and shape excitons independent of dot size has not been known. The inventors have found that a crucial drawback of prior art SiQD functionalizations includes a lack of understanding about the need to design to electronic energy levels resulted in Type-I energy level alignments between dot and ligand, which sets the optical gap to that of the bare dot.

The inventors have devised various strategies for engineering optical properties via surface functionalization. For example, in FIG. 2, a Type-II interface between the dot and the ligand should be formed to reduce the optical gap, and a vinyl conjugating connection should be applied to enhance oscillator strength resulting in a large absorption cross section. Since the optical gap of the passivated SiQD depends on the relative energy levels between the HOMO of the ligand and the LUMO of the dot, it should be possible to tune the absorption gap of this hybrid material by proper choice of dot and ligand. It is also distinct from the well-known quantum confinement effect and decouples quantum dot size from energy absorbed.

The inventors have found that it is possible to create systems in which the electronic orbitals of the QD-organic hybrid are truly hybrids of the states in the QD and the π-electron system of the organic ligand. For example, FIG. 3 shows results of computational experiments showing the shifting of HOMO/LUMO distributions and lowering of the band gap when adding 4-vinyl-N,N-bis(4-methoxyphenyl) aniline (MeO-TPA) organic moieties to a 2.6 nm diameter $Si_{465}H_{228}$ quantum dot surface (right). In this example, the HOMO is distributed within the 4-vinyl-N,N-bis(4- methoxyphenyl)aniline (MeO-TPA) surface ligand, while the LUMO resides in the SiQD core. Traditional decene surface functionalization does not change the SiQD electronic orbital distribution. The inventors were thus advantageously able to tailor properties of the system using knowledge in conjugated small molecule chemistry. In some embodiments, the conjugated organic group is connected to the SiQD surface using a vinyl linkage, without which there is no electronic communication. For example, SiQDs usually exhibit weak absorption in the region below 3 eV (above 410 nm), due to their indirect transitions however, the extinction coefficient in the SiQD-organic hybrid can be advantageously enhanced and shifted spectrally, thereby enhancing utilization.

Illustrative Carrier Mobility in Silicon Quantum Assemblies

In various embodiments, although many SiQD applications are not associated with carrier transport between neighboring dots, efficient carrier dynamics is an issue in harnessing the true power of quantum dot materials for solar cells, light emission and many other uses. For example, larger dots may be encapsulated within an inorganic amorphous matrix. A low binding energy allows excitons to thermally dissociate and charge carriers hop from dot to dot by overcoming an energy barrier imposed by the matrix, i.e., a Type-I bulk heterojunction. The inorganic matrix offers high stability and a simple interface structure; however, technologically relevant carrier mobilities would require precise control of both dot size and spacing, and such precision in silicon systems has not been achieved in the prior art.

Another approach is to encapsulate the dots within an organic polymer blend. The energy level alignment of dots and the polymer are such that holes prefer one material while electrons prefer the other so as to create a Type-II heterojunction. A large interface area is arranged for which the donor-acceptor separation is within an exciton diffusion length of the absorption site. Such an approach takes advantage of solution processing and the strong absorption of conjugated polymers; however, it suffers from instability in ambient environments. In addition, the efficiency of current SiQD/P3HT solar cells is only 1.1%. The inventors, based upon their research, theorize that this may be due to the difficulty in controlling the interface morphology, which results in high carrier recombination rates and low carrier mobility.

In consideration of the above, and in view of their knowledge of conjugated dot ligands, the inventors theorized that it may also be possible to improve transport between SiQDs by linking them with conjugated bridge moieties. Thus, the inventors designed bridge networks to establish a Type-II interface between dots and bridging units. This provides a means of overcoming the relatively high exciton binding energies of small SiQDs, allowing charges to separate. Such chemical connections between donor and acceptor are thought to result in much faster charge separation for QDs within organic blends such as P3HT/CdSe and PbS/MEH-PPV. In this paradigm of inter-penetrating networks, electron hopping is from dot to dot while the linking molecules transport holes. Such networks can be designed so that the rate of electron hopping is enhanced by the linking molecules even though no intermediate hop is made. The connecting moiety has energy levels that are not resonant with either the donor or acceptor, but it can still improve the electronic coupling of their respective orbitals. The electronic overlap between the dots is increased by establishing conjugated covalent bonds between the dots and the bridge. This process is known as superexchange because of its configurational similarity to Kramers-Anderson superexchange, where strong magnetic coupling can exist between two cations that are separated by a nonmagnetic but mediating anion.

The inventors have also designed quantum dots that are adjacent to neighboring bridges to improve the electronic overlap of states localized on the bridge molecules. The result is that hole hopping from bridge to bridge is enhanced. Herein, the combined electron and hole dynamics are referred to as double superexchange (DS).

This new Type-II heterostructure is fundamentally distinct from recently considered networks of PbSe and CdSe dots. Such dots are initially terminated with long organic groups but can be made to undergo a ligand exchange reaction with small inorganic molecules, which allows them to be more closely packed. As shown by experimental analysis, the resulting network is composed of dots that are covalently bonded to each other through bidentate ligands. This results in dramatically improved charge mobilities attributable to improved electronic overlap. Such results are explored in a recent computational investigation of CdSe QDs with bidentate Sn2S6 linkers. However, these are Type-I heterostructures, and the ligands constitute a barrier to both electron and hole hopping between the dots. The proposed architecture is also similar to that of small molecule solar cells but is distinguished by its double superexchange property. The inventors completed an analysis using 1.7-nm diameter SiQDs (Si47H100 bridged by a 2,5-divinylthiophene-3,4-diamine ($C_8H_8N_2S$)), where the bridge was found to increase mobilities by 3 and 5 orders of magnitude for electrons and holes, respectively.

Figure 4:
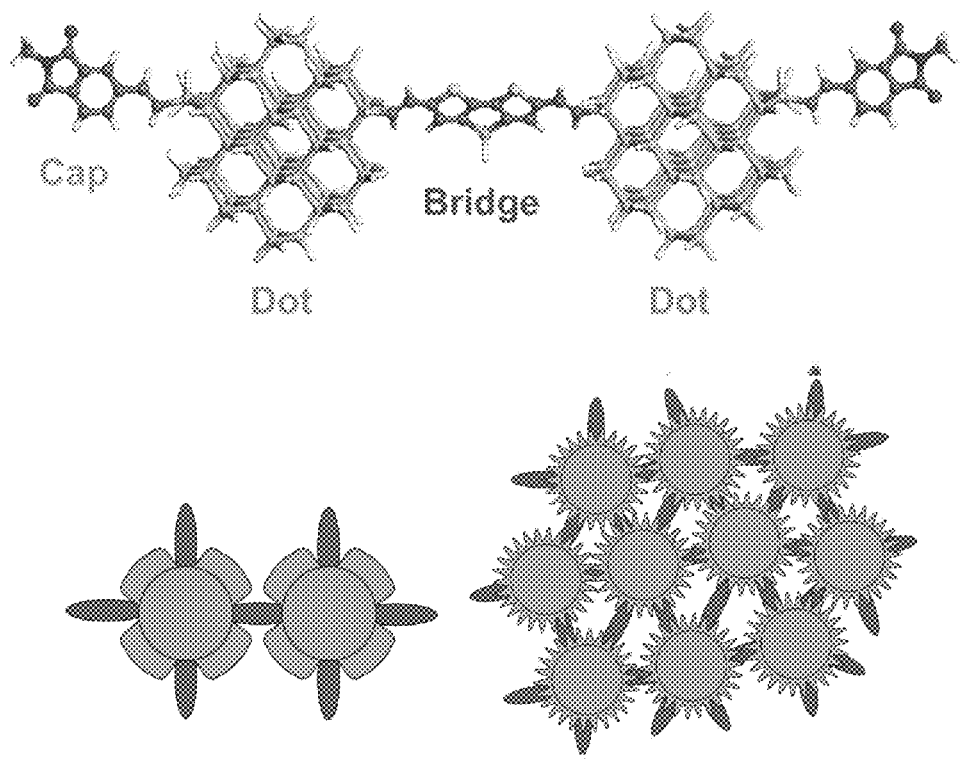
FIG. 4 shows an illustrative composite core/shell structure.

As detailed above, conjugated ligands can be used to tailor photo-absorption and conjugated linkers can be used to vastly improve exciton dissociation and carrier mobility. A composite structure of dots with specialized functionalization and bridging, as shown in FIG. 4 for example, offers the prospect of engineering the complete optoelectronic character of SiQD mesomaterials. FIG. 4 shows capping and bridging of SiQDs that amounts to a composite core/shell structure with direct connectivity between neighboring cores.

In further illustrative embodiments, the inventors have investigated tailoring the opto-electronic properties of SiQDs by blending computational design with synthesis and characterization to map out a materials genome for a new class of hybrid SiQDs functionalized with organic ligands. Various combinations of dot/ligand, dot/bridge and dot/ligand/bridge combinations were created and evaluated.

Figure 5:
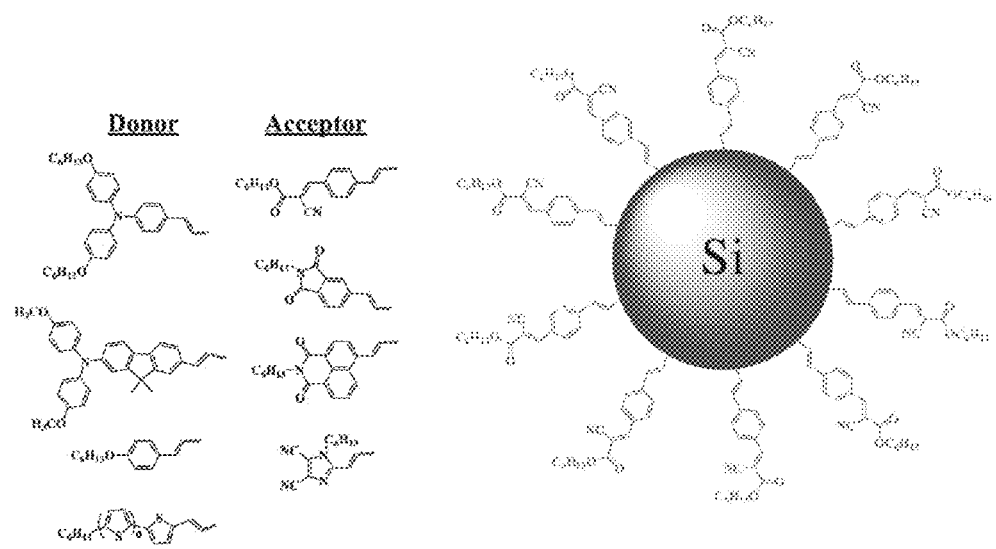
FIG. 5 shows illustrative selected organic electron donor and acceptor moieties.

FIG. 5 shows selected organic electron donor and acceptor moieties that could be attached to the SiQD surface, where an example of a phenylvinylcyanoester (acceptor) decorated SiQD is shown. In various embodiments, the vinyl connectivity allows for electron delocalization, and the alkyl side chains allow for solubility.

Illustrative Experimental Plan

The combined computational and experimental investigation was directed towards designing, synthesizing and characterizing small SiQDs with peripheral organic ligands that: (1) allow for easy processability; (2) allow for tailoring of optical properties independent of dot size; and (3) improve electronic coupling between QDs. The inventors focused on 1-4 nm SiQDs with vinyl connectivities between the SiQD and peripheral aromatic ligand.

Such a unique Si-vinyl-aromatic ligand linkage offers the prospect of strong orbital overlap between dots, bridges and terminating groups that facilitates rapid carrier transport. For example, an illustrative key feature of these hybrid structures is that electronic states reside on both the inorganic SiQD core as well as the organic semiconductor shell (see, for example, FIG. 3). Also, intimate electronic tethering of the organic semiconductor to the SiQD allows for the formation of a truly hybrid semiconductor (see, for example, FIGS. 4 and 5). This is different from more traditional approaches for modifying QD surfaces with alkyl groups to reduce the defect density of surface states, improve the processability, and protect from oxidation. As many of the organic semiconductors allow for the modification of solubilizing groups, the inventors have been able to move beyond defect and solubility control to engineer electronic structure and optical absorption and study the unique electronic and optical properties of such systems. Due to the diverse number of possible organic semiconductors (e.g., a small set of illustrative examples shown in FIG. 5), the inventors have been able to develop design rules for modifying the electronic and optical properties, beyond quantum confinement of the QD.

Illustrative Computationally Tailored Properties of Unbridged Dots

The inventors created sets of dot/ligand pairs with tailored gaps and absorption/emission spectra based on their investigation of conjugated ligands. For example, the inventors developed a substantial matrix of potentially useful ligands to be attached to the SiQD periphery and carried out computational screening using DFT, DSCF method, to estimate HOMO/LUMO energies as compared to those for a range of QDs. Combinations with some potential for a Type-II energy level alignment were subjected to a second round of screening in which dots were functionalized with varying degrees of coverage. The energy levels and orbitals were again generated to assess the orbital sharing, optical gap of the spatially separated exciton, and absorption cross section.

Dot/ligand pairs that survive this two-step screening were computationally interrogated in more detail using timedomain DFT (TD-DFT). These calculations, in turn, were verified using quasi-particle and Bethe-Salpeter calculations for individual moieties and small composite structures. Such excited state calculations offer a refined estimate of the optical gap and allow prediction of FTIR, UV/Vis and photoluminescent (PL) spectra. This data was compared directly with experimental data. Molecular dynamics (MD) simulations were then carried out to estimate solubility. This allowed comparison of MD results with experimental realizations. The workhorse code for this will be the LAMMPS package, a publicly available parallel code.

The net result of this computational effort was a preliminary set of dot/ligand pairings to be synthesized. Data from the synthesis and characterization teams were used to both verify and tune the design procedure. In addition, this computational information elucidated the effects of the electron-donating and/or electron-withdrawing nature of the organic ligands on the photophysics of the hybrid inorganic/organic semiconductor systems.

Figure 6:
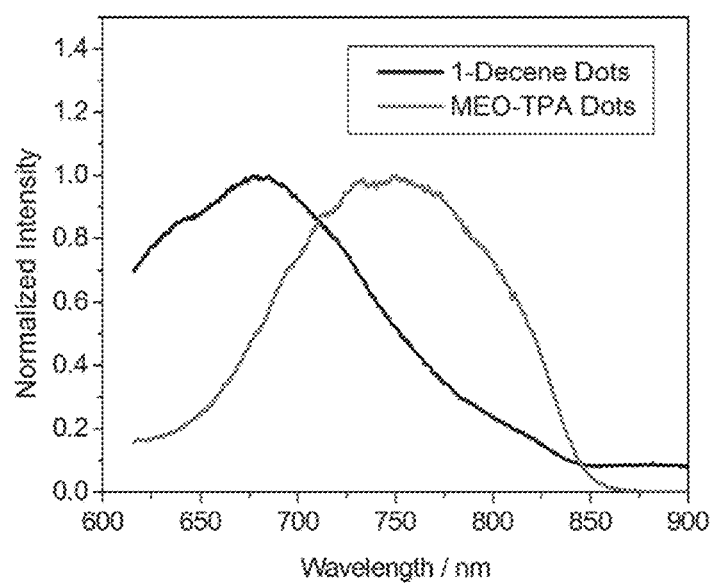
FIG. 6 shows illustrative photoluminescent experimental results.

For example, FIG. 6 shows photoluminescent experimental results showing the effects of decyl (black line) versus 4-vinyl-N,N-bis(4-methoxyphenyl)aniline (MeO-TPA) (red line) terminated SiQDs. The red shift of 80 nm is consistent with the computational results. To the inventors' knowledge, such a magnitude of red shifted PL based on peripheral ligand attachment was previously unknown.

Success in the creation of thin films of SiQD with good carrier transport mobility served as a starting point for one of the goals of the investigation: the creation of SiQD films in which the ligands and bridges work together to control optical properties and transport. The associated three-component interactions (e.g., QD, ligand, and linker) offered significant computational and synthesis challenges. However, the inventors have been advantageously able to work from the basis of an understanding of dot/ligand and dot/bridge interactions. This allowed the inventors to design for improved charge separation of directly generated, spatially separated excitons.

Illustrative Synthesis of Unbridged, Hybridized Dots

Chemical synthesis was carried out in view of the inventors' knowledge regarding designing and synthesizing organic and hybrid semiconductors and regarding Si—C bond formation methods using hydrosilylation chemistry to link alkene and alkyne functionalized molecules (organic component) to Si—H (SiQD surface) and other relevant Si—C formation reactions. For example, initial experimental results were achieved showing an 80 nm photoluminescent red shift when attaching MeO-TPA versus decyl to the SiQD surface (see, e.g., FIG. 6). This example validates the computational results (See FIGS. 1-3), thereby providing advantageous results that surface ligands can play a major role in the optoelectronic properties of SiQDs. Such advantageous results were possible, for example, by designing the systems using electronic structure analysis before being synthesized.

Small, monodispersed, highly crystalline SiQDs in the 1-4 nm range were provided (e.g., produced by Dow-Corning in >1 g batches of size-pinned SiQDs with a standard deviation in diameter of approximately 15%). The SiQDs were dispersed in a low vapor pressure solvent at (e.g., at Dow-Corning) and obtained for use by the inventors in the ligand attachment chemistry. If the SiQDs were partially oxidized as received, an HF etch process was performed.

Figure 7:
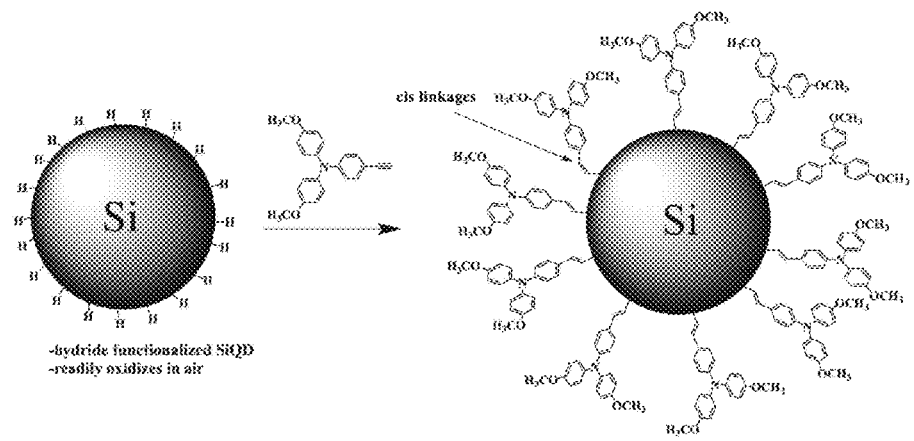
FIG. 7 shows an illustrative thermal hydrosilylation reaction.

The chemistry to attach aromatic ligands to SiQDs with a conjugated vinyl link was performed, for example, using a thermal hydrosilylation approach as shown in FIG. 7. FIG. 7 shows an illustrative thermal hydrosilylation reaction of hydride terminated SiQDs with alkyne functionalized aromatic ligands that results in a vinyl linkage with up to 25% cis linkages. The cis linkage reduces electronic communication between the SiQD and the ligand; 100% trans is desirable.

This approach requires the reaction of hydride terminated SiQDs with alkyne functionalized aromatic ligands. The inventors initially used this approach initially but found some limitations. For example, there is evidence from model reactions that a significant amount of cis linkages are formed that will not effectively promote electronic communication between the SiQD and the aromatic ligand. Also, the hydride terminated SiQD is fairly reactive towards oxidation in ambient conditions and must be handled in a glovebox. To address these issues, the inventors used a route shown in FIG. 8, where hydride terminated SiQDs were reacted with triisopropylsilylacetylene followed by deprotection of the triisopropylsilyl group resulting in vinyl terminated SiQDs. The deprotection process targeted the cleavage of the vinyl-Si(iPr)3 bond and left the surface functionalized with vinyl groups. The vinyl terminated SiQDs (vinyl-SiQDs) were much more resistant to oxidation than their hydride analogs and may be used as a "stock" material to access many hybrid structures. Next, the vinyl-SiQDs underwent palladium catalyzed Heck reactions with halo-aromatics to provide only trans linkages that will allow for efficient delocalization of electrons between the organic ligand and SiQD. Further, from a synthetic perspective, alkyne functionalized aromatics are less stable than their haloaromatic analogues and must be carefully isolated and stored. In addition, alkynes are generally derived from halo-aromatics, so being able to utilize the haloaromatics directly to form the target hybrid structures is advantageous.

Figure 8:
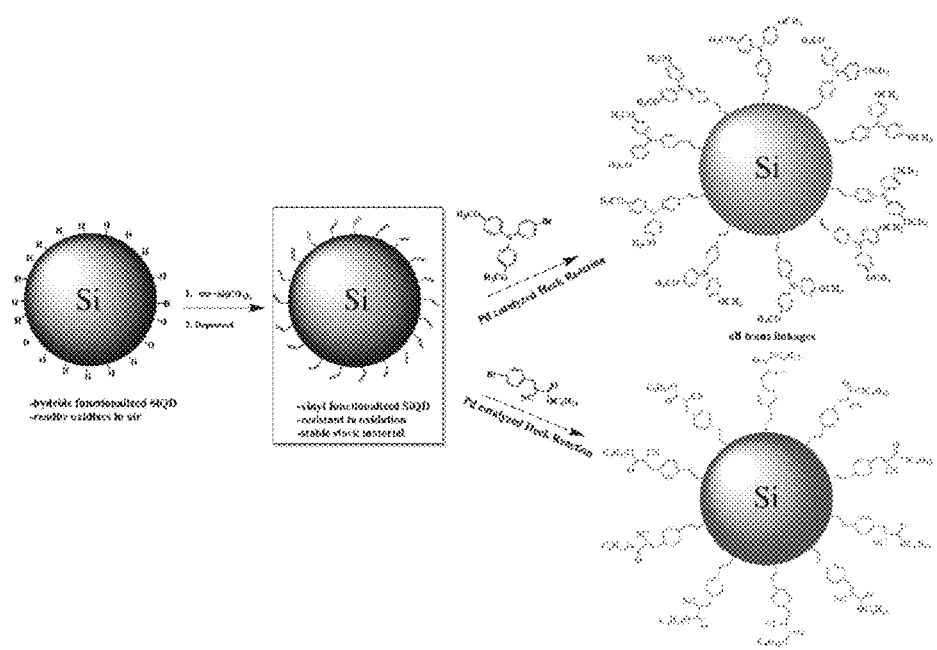
FIG. 8 shows an illustrative procedure to prepare vinyl functionalized SiQD.

An exemplary procedure to prepare vinyl functionalized SiQD is shown in FIG. 8. FIG. 8 shows an illustrative procedure to prepare vinyl functionalized SiQD that can be used, e.g., as a stock material to prepare the target hybrid materials with 100% trans connectivity between the SiQD and the aromatic ligand. The vinyl-SiQD shown in FIG. 8 will be much more ambient stable than its hydride counterpart so the oxidation will be minimized. The hybrid SiQDs can be prepared with hole (blue) and electron transporting (red) properties either in the core or on the ligand, depending on the peripheral ligands.

Illustrative Structural, Optical and Electronic Characterization of Unbridged Dots Optical studies were carried out to investigate the exciton dynamics that take place in the hybrid SiQD systems. Optical absorption measurements were used to a) reveal the degree of electronic communication between the SiQD and its π-conjugated organic shell and b) quantify the quantum confinement in the hybridized dot through measurement of the optical gap and PL lifetime.

These measurements were compared directly with the inventors' theoretical predictions and were used to assess the degree to which quantum confinement, vinyl connectivity and energy level alignment delivered the anticipated strong hybrid absorbers.

The impact of the organic ligand on the excited state electronic structure of the modified QDs was investigated using photoluminescence (PL) spectroscopy. Important properties such as exciton lifetimes and quantum yields were evaluated relative to the conjugated organic modifier systems. Exciton lifetimes were studied using Time-Resolved PL (TRPL) and Time Correlated Single Photon Counting (TCSPC) in order to evaluate the effects of the organic ligand properties on the charge transfer efficiency and rate constant. Additionally, the photophysics was explored through Transient Absorption Spectroscopy (TAS) measurements. This allowed the inventors to study the impact of organic peripheral groups and the resulting changes in the electronic structure on charge generation and recombination processes with a goal of developing electronically tunable building blocks for energy conversion devices. As a demonstration of this, hybrid SiQD systems were evaluated in thin film device architectures, as discussed herein. Electron Spin Resonance (ESR) characterization was also carried out to fully understand the chemistry taking place on the surface of the SiQDs.

These studies enabled the inventors to characterize defects caused by dangling bonds of unsaturated Si atom or by spin radicals that are induced by incomplete bonding between the surface of the silicon and the linkage to the ligand. These charged defect states would strongly influence the electronic structure of the individual SiQD and negatively impact exciton and charge motion in solid materials. ESR, combined with computational predictions of the influence of defects on PL, provided useful feedback to the synthetic component of the project to mitigate their formation.

Solid-phase film studies were also conducted using the unbridged dots. Films were fabricated by standard solution coating methods of spin-coating or blade coating. Furthermore, formation of ordered nanoarrays (superlattices) of the SiQDs were explored by several illustrative methods. First, blending of the SiQDs into block copolymer templates was done to induce regular arrays of the dots, using materials such as ZnO. Second, simple slowdrying from solution, accomplished by drop-casting in solvated environments, was done as a means of forming self-assembled nanoarrays. The inventors have previously shown this to be possible with $TiO_2$ quantum dots with appropriate ligand groups, and similar growth mechanisms may exist here. These films were also characterized by the optical methods and ESR experiments described herein, and by the structural and electronic measurements described herein, in the context of bridged-dot mesomaterials.

Morphology characterization of the hybrid SiQD systems was carried out using a combination of wide-angle x-ray scattering (WAXS) and small angle x-ray scattering (SAXS). WAXS experiments were performed at beamline 11-3, with a fixed energy of 12.7 keV, set-up in the reflection geometry with a two-dimensional detector, and a variable q-range. This beamline is particularly suited to measure the crystallinity of the individual quantum dots due to its low background scattering, high resolution and variable q-range. The two-dimensional WAXS data was used to determine the crystal space group, lattice parameters, fault density, and crystallite size.

SAXS was used, in concert with optical characterization to quantify the degree to which dilute solutions of the hybrid SiQD are aggregated. Specifically, SAXS as a function of hybrid SiQD solution phase concentration was carried out in order to determine the concentrations at which the nanoparticles begin to aggregate, and how the aggregate size varies with concentration. Below this critical aggregation concentration, the inventors expected to see SAXS consistent with single nanoparticles in solution. Upon aggregation, the line shape of the SAXS pattern shifted from non-interacting dilute spheres, to that of a fractal aggregate, with a concomitant increase in the observed size of the solution phase particles.

Illustrative Improved Electronic/Excitonic Coupling Between SiQDs

Another facet that the inventors explored was the use of conjugated connectivity in bridging SiQDs to create a thin film QD mesomaterial. This is shown schematically in FIG. 4, although the dots to be considered will be on the 1-4 nm scale, which is significantly larger than that shown in order to illustrate the concept.

Illustrative Computational Design of Bridged-Dot Mesomaterials

Computational design of dot/bridge connections was done in two phases: (a) dot bridging with standard ligands; and (b) dot bridging with ligands that induce dissociated excitons. Once again, the inventors began with an experimentally informed computational design procedure using a matrix of potentially interesting bridge moieties. D-DFT was used as an initial screening tool to identify combinations of dots and bridges with roughly suitable energy level alignments. As previously described, excited state analyses was carried out on promising structures in order to obtain more accurate estimates of energy level alignments.

This two-step screening processes was followed by a computational prediction of key exciton dissociation and carrier transport rates. The associated computational methodology used phononassisted transport theory beyond the standard Marcus and MJL (Marcus, Levich and Jortner) theories, and excited-state electronic structure beyond those estimated from density functional theory (DFT). The Marcus and MJL equations have been used to calculate the charge transfer rates. However, the inventors note that they are based on assumptions that are not satisfied by the systems of interest in this disclosure. In particular, the frequencies of most phonon modes far exceed the energy of thermal fluctuations at room temperature so the high-temperature approximation on which Marcus theory is based is not valid. In addition, the reorganization energy spectrum is too broad to be represented by a single effective mode, so the MJL equation cannot be used either.

At the dot/bridge interfaces, coupling to the environment is strong while coupling between donor and acceptor is comparatively weak. The assumption of carrier transport via incoherent non-adiabatic quantum tunneling scenario is therefore reasonable, and the inventors' computational assessment of charge dynamics was based on what is often referred to as the full quantum treatment, which is based on perturbation theory. In the high-temperature limit this reduces to that of Marcus theory. The approach has an implicit assumption that the phonon-assisted charge transport is slower than vibrational relaxation, making it reasonable for the inventors to employ an equilibrium phonon occupation. In cases where this condition is not met, the inventors employed a self-consistent correction procedure wherein a cutoff phonon frequency is set to the original transfer rate. By excluding the contribution of the phonon modes with frequencies lower than this cutoff, a new rate and a corresponding new cutoff frequency were obtained. Such iterations was continued until self-consistency was reached.

Driving forces were computed as the energy changes of isolated donor and acceptor, plus the Coulomb interaction between pairwise charges localized on each atom obtained by Mulliken population analysis. The reorganization energy was divided into an inner part and an external (solvent) part and was subjected to modal decomposition. A Conductor-like Screening Model (COSMO) was used to account for the dielectric effect of the solvent. To be of practical use, interfacial polarons must dissociate into free carriers. The associated Coulomb well, i.e., the energy difference between CT and SC states, can be as large as 0.31 eV and an electric field may be required to promote efficient dissociation. However, an analysis based on the Onsager-Braun model indicated that the voltage drop across the cell during normal operation should provide the electric field required. This methodology was successfully implemented and was used to estimate, for instance, several key rates associated with charge dynamics for a SiQD system bridged 2,5-divinylthiophene-3.4-diamine (see, for example, FIG. 9).

Figure 9:
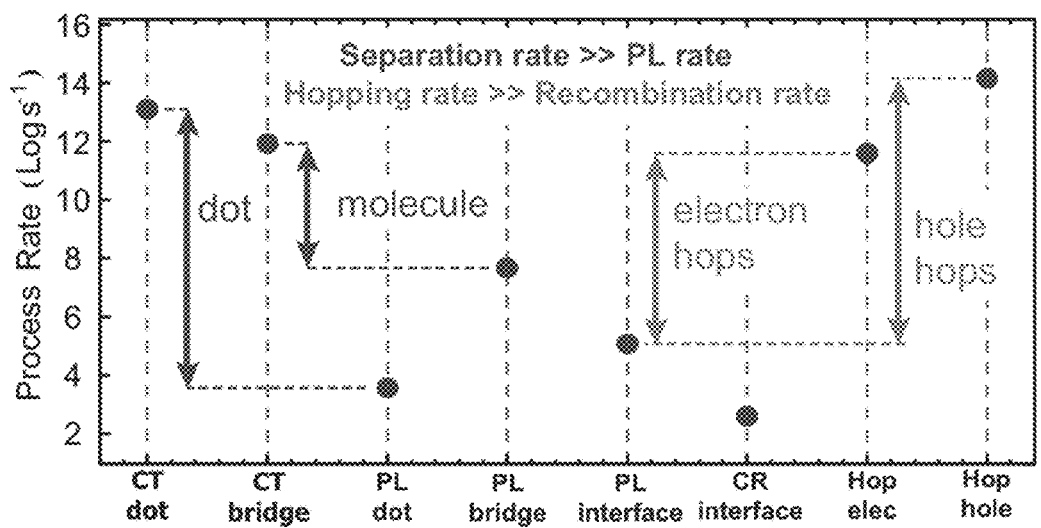
FIG. 9 shows illustrative charge transfer, photoluminescence, charge recombination and carrier hopping rates.

FIG. 9 shows charge transfer, photoluminescence, charge recombination and carrier hopping rates at the dot/bridge interface. Blue and green arrows draw attention to competing rates.

Dot/bridge systems that show the most promise were used to computationally create small QD mesomaterial domains. This was carried out using reactive molecular dynamics (RMD) simulations intended to simulate the actual processes that will result in linked assemblies. The inventors used experience in working with, and developing fits for, the ReaxFF potential implemented in LAMMPS. This facilitated an understanding of the tie between system/environmental coupling and transport as well as transport robustness in face of geometric uncertainty. The inventors experimented with a distribution of SiQD sizes and moiety concentrations to predict representative structures that were compared directly with the measurements carried out at SSRL.

Illustrative Synthesis of Bridged-Dot Mesomaterials

The inventors used model reactions of hydride and vinyl functionalized silsesquioxane (SSQ) cages to mimic the SiQDs. For example, the inventors demonstrated the bridging reaction of 2,7-dibromo-9,9-dimethylfluorene with heptaisobutylvinyl SSQ (see, for example, FIG. 10).

Figure 10:
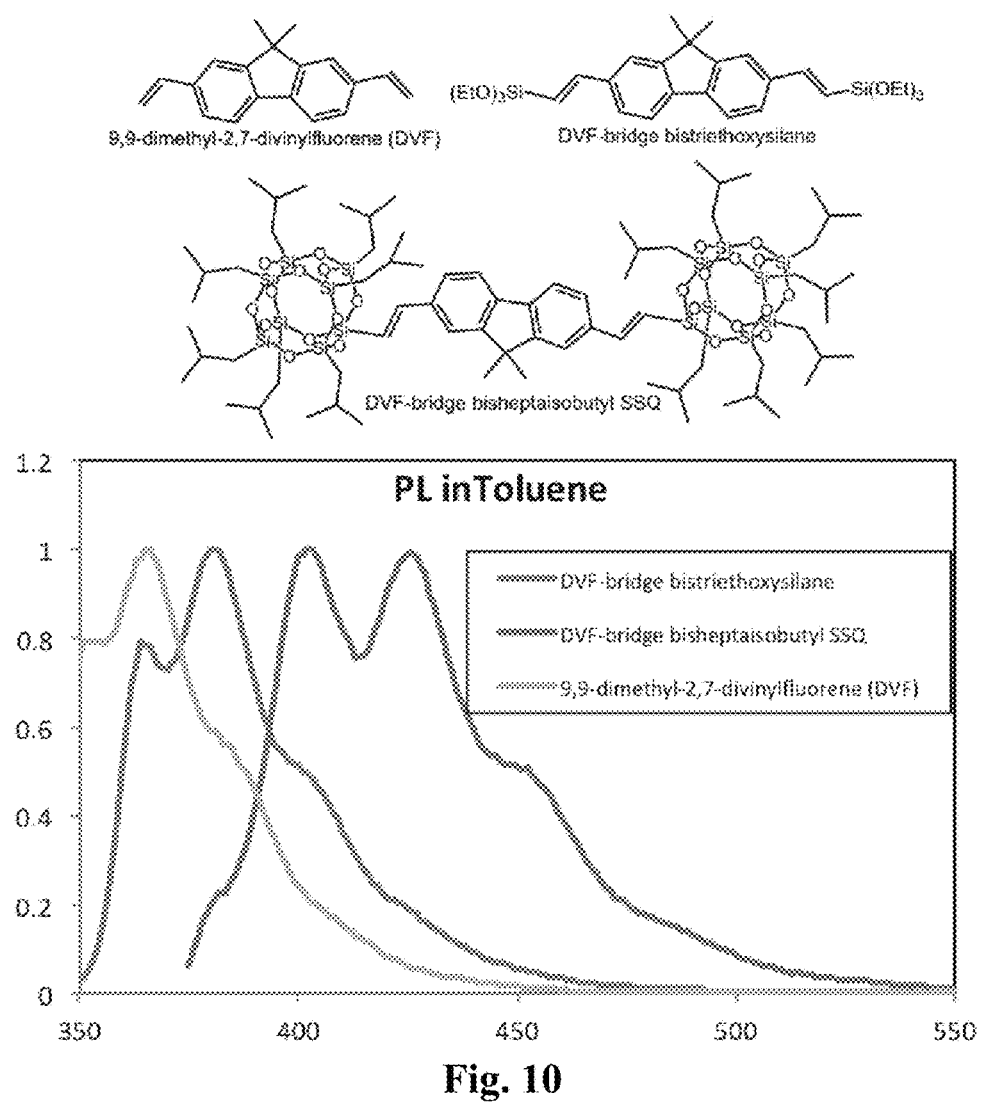
FIG. 10 shows illustrative photoluminescent spectra.

FIG. 10 shows photoluminescent (PL) spectra of 9,9-dimethyl-2,7-divinylfluorene (DVF) (green) and its analogues with triethoxylsilane (blue) and heptaisobutyl SSQ (red). The spectra shown in FIG. 10 suggests electron delocalization within the SSQ cage.

Interestingly, the bridged SSQ product has >20 nm red shifted PL (e.g., the red curve in FIG. 10) versus the 2,7-bis(vinyltriethoxysilyl)-9,9-dimethylfluorene (e.g., the blue curve in FIG. 10), and starting 9,9-dimethyl-2,7-divinylfluorene (DVF, e.g., the green curve in FIG. 10), which is a promising result suggesting the SSQ may contribute to the delocalization of electrons. Thus, the inventors partially derivatized the SSQ surface (either octavinyl- or octahydrido-SSQ, which is commercially available through Hybrid Plastics) with ligands of interest in order to retain reactive surface groups, i.e., Si—H when using hydride functionalized SSQ, or Si-vinyl when using vinylfunctionalized SSQ. The inventors then reacted these activated SSQs with diacetylene- or dibromo-functionalized aromatics to link the SSQs together using conjugated bridges. This was done using solution chemistry where the material of interest precipitated out, followed by characterization. Further, the inventors deposited the activated SSQs as thin films together with an excess of the difunctional bridging aromatics, and then performed the bridging chemistry to create insoluble continuous thin films.

Excess unreacted difunctional aromatics were removed via a simple washing process to leave the thin film of interest behind for analysis. The extent of bridging chemistry was controlled to preserve the continuous thin film properties. Next, using what was learned from the SSQ bridging process, the inventors used towards SiQDs to make the QDM structures (see, for example, FIGS. 4 and 11). In a procedure similar to the SSQ approach described herein, the inventors prepared "reactive" hybrid SiQDs by controlling the amount of surface ligands so that Si—H or Si-vinyl groups were available for the bridging chemistry. The inventors again prepared precipitated powders or thin films for analysis. These materials were characterized and compared to their un-bridged analogues. Preliminary results (see, for example, FIGS. 9 and 10) demonstrate the feasibility of this approach using model reactions to computationally predict and realize Si—C bonds reacting using either bromo-aromatics with vinyl silanes or alkynes with silyl hydrides that red shifts the photoluminescence by 20 nm.

Illustrative Structural, Optical, and Electronic Characterization of Bridged-Dot Mesomaterials Carrier transport measurements of the bridged-SiQD thin films via Field Effect Transistors (FETs) were carried out. FET measurements were particularly useful for characterizing transport in SiQD systems, as they can access high carrier concentration regimes that provide a rigorous test of the charge transport ability of the material. Such information provided a method of characterization of inter-dot coupling of the solid films, with better coupling resulting in higher values of charge carrier mobility. The inventors fabricated FET devices using a standard top-gate geometry with interdigitated source drain electrodes with a variety of channel lengths (5-25 μm), into which SiQD films were deposited or grown. Mobility values were extracted from device performance curves using standard square law theory. This information was fed back to the theoretical component of the project, and the inventors investigated the formation of electronic minibands that was expected in a highly coupled, well ordered superlattice, and which may be present in the disclosed mesomaterials as well.

Figure 11:
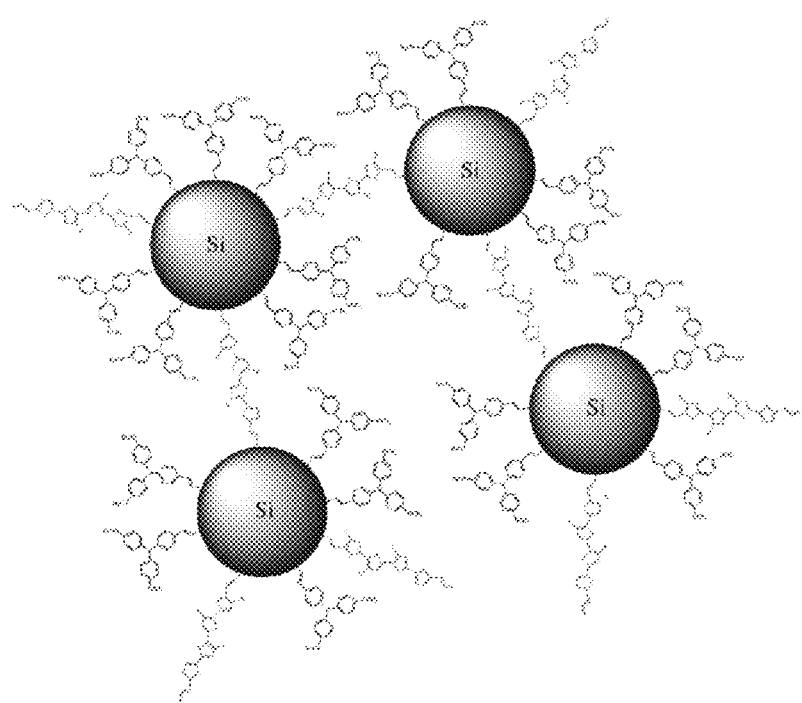
FIG. 11 shows an illustrative depiction of an isolated QDM region.

FIG. 11 shows an illustrative depiction of an isolated QDM region where SiQDs are linked with conjugated oligothiophene bridges.

Figure 12A:
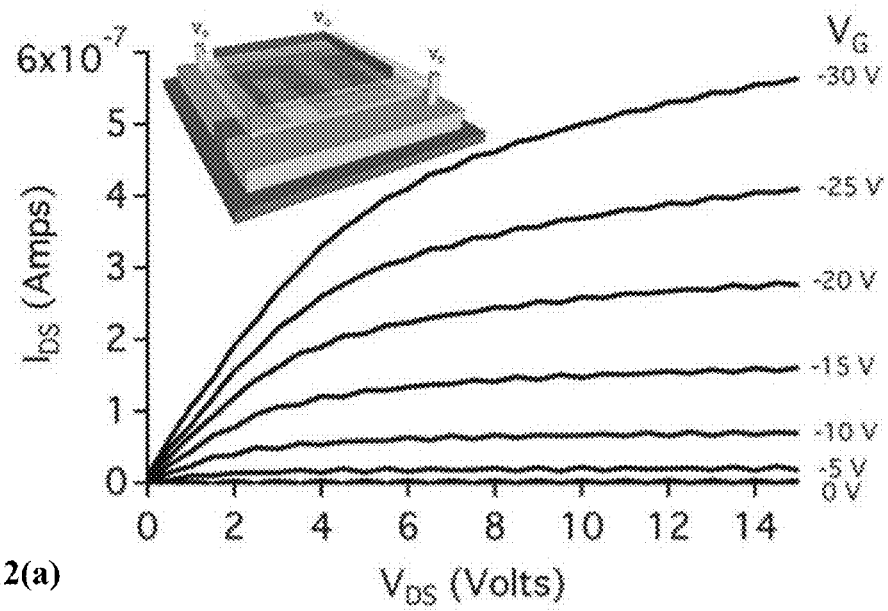
FIG. 12(a) shows an illustrative example FET performance curve.
Figure 12B:
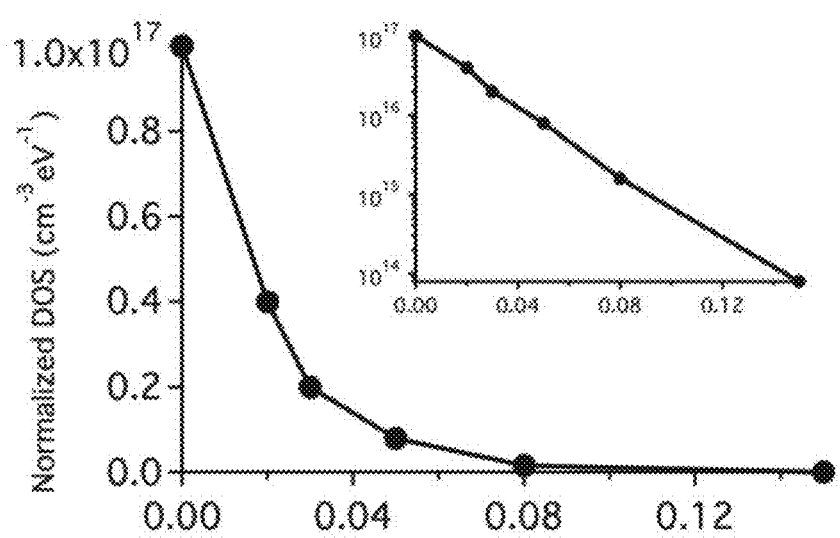
FIG. 12(b) shows an illustrative trap DOS.

In addition, to provide a characterization of the carrier mobility, FET measurements provided a facile method for the inventors to understand the electronic defect structure of the materials. This was done by making use of the modulation of carrier density over many orders of magnitude, including very low concentrations, which was possible to a fine precision by adjusting the gate voltage in a FET. Based on this approach, a number of formalisms were developed for extracting the trap Density of States (DOS) from the performance curves. The inventors had the ability to do this, as shown in FIG. 12, for data derived from an organic FET. FIG. 12 (a) shows an example FET performance curve, based on the organic semiconductor poly(3,3'''-didodecyl quarter thiophene) (PQT-12), and a square law fit of VDS to VG yields a mobility of $1.5 \times 10-3$ cm2/(Vs); and FIG. 12(b) shows trap DOS, as extracted from data in (a), plotted with respect to the energy above the mobility edge (trap-free band) energy, where the inset shows the same data on a log-linear plot. This procedure was carried out with SiQD films, and the information was correlated with optical measurements and with theory to formulate a detailed picture of the band and defect structure resulting from the interaction of the SiQD core and organic shell.

FETs also present a unique opportunity to study the charge transport of a material under high pressure and thus with reduced inter-particle spacing. Application of high pressure can induce increased mobility by compressing the material and enhancing the strength of the transfer integral between charge carrier sites.

Figure 13:
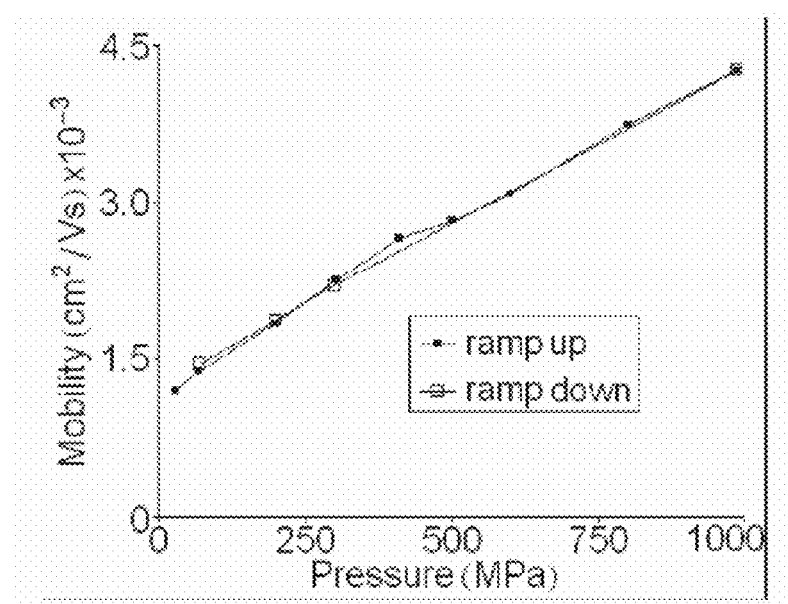
FIG. 13 shows illustrative pressure dependence of FET mobility.

An example of this is seen in FIG. 13. FIG. 13 shows illustrative pressure dependence of FET mobility measured for a film of the organic semiconductor P3HT. The analogous experiment was carried out in this project, with the results providing distinct and important feedback to the inventors' theoretical investigations into the electronic structure of the hybrid SiQD. Although the inventors' previous work in this area was limited to a maximum pressure of 1 GPa, advances in diamond anvil cell methods allow for pressures of several 10's of GPa to be achieved with table-top instruments. Thus, the inventors developed this capability for this disclosure and applied it, for the first time, to SiQDs via diamond anvil cells modified to allow in situ electrical measurements.

Additional characterization of the bridged-dot mesomaterials by optical methods and by ESR studies was carried out as described herein for unbridged dots. In order to further understand the mesoscale structure within the QDM, the inventors performed SAXS experiments on beamline 1-5. This was a small angle scattering beamline able to measure periodicity in the range of 1-100 nm which utilized a two-dimensional detection scheme in order to observe both in-plane and out-of-plane scattering. The beamline featured low background signal and variable energy range (4-16 keV). The capability to work at large x-ray energies made it possible to measure these superstructures in the reflection as well as the transmission geometries on standard substrates, enabling full three dimensional characterization of the superstructure. The SAXS analysis allowed determination of the design rules that govern the superstructure formation. The inventors also performed Warren-Averbach analysis in order to quantify the degree of disorder present within the superstructure. This combined multi-scale morphology characterization not only provided us with a set of design rules, which enabled tuning hybrid QD assembly, but also allowed us to relate the observed opto-electronic properties to the space group, inter-particle spacing, crystallographic orientation and disorder present within the system. The inventors' computational and experimental efforts were carried out on the same length and time scales to facilitate quantitative comparison and unambiguous insights.

Additional Illustrative Embodiments

In further embodiments, a new optoelectronic mesomaterial is proposed in which a network of quantum dots is covalently connected via organic molecules. Optically generated excitons are rapidly dissociated with electrons subsequently hopping from dot to dot while holes transit via the connecting moieties. The molecules serve as efficient mediators for electron superexchange between the dots, while the dots themselves play the complementary role for hole transport between molecules. The network thus exhibits a double superexchange. In addition to enhancing carrier hopping rates, double superexchange plays a central role in mediating efficient polaron dissociation. Photoluminescence, dissociation, and transport dynamics are quantified from rst-principles for a model system composed of small silicon quantum dots connected by organic moieties. The results demonstrate that double superexchange can be practically employed to significantly improve charge generation and transport. These are currently viewed as the critical obstacles to dramatic enhancements in the energy conversion efficiency of photovoltaic cells based on quantum dots.

Very small silicon quantum dots have properties that make them particularly attractive for photovoltaic and optoelectronic applications. Compared with dots of greater size, these should absorb photons more readily, transport excitons more efficiently, can be made essentially free of defects, and resist oxidation better. In addition, these small dots use their slice of the solar spectrum more efficiently, show greater promise in multiple-exciton generation and hot carrier collection paradigms, and have a higher electronic coupling for the same surface-to-surface distance.

To achieve their promise, though, these dots must be assembled in a way that allows energy to be efficiently harvested. An idea that has been explored for larger dots is to encapsulate them within an inorganic amorphous matrix. A low binding energy allows excitons to thermally dissociate and charge carriers hop from dot to dot by overcoming an energy barrier imposed by the matrix, i.e. a Type-I bulk heterojunction. The inorganic matrix offers high stability and a simple interface structure, but technologically relevant carrier mobilities would require precise control of both dot size and spacing. Although such precision has recently been achieved with PbS QDs in a ZnS matrix, analogous fidelity with silicon systems has yet to be achieved.

A second approach is to encapsulate the dots within an organic polymer blend. The energy level alignment between dots and the polymer is such that holes prefer one material while electrons prefer the other so as to create a Type-II heterojunction. A large interface area is arranged for which the donor-acceptor separation is within an exciton diffusion length of the absorption site. The approach takes advantage of solution processing and the strong absorption of conjugated polymers but suffers from its instability in ambient environments. In addition, the efficiency of current SiQD/P3HT solar cells is only 1.1%. This is most likely due to the difficulty in controlling the interface morphology, which results in high carrier recombination rates and low carrier mobility.

Figure 14A:
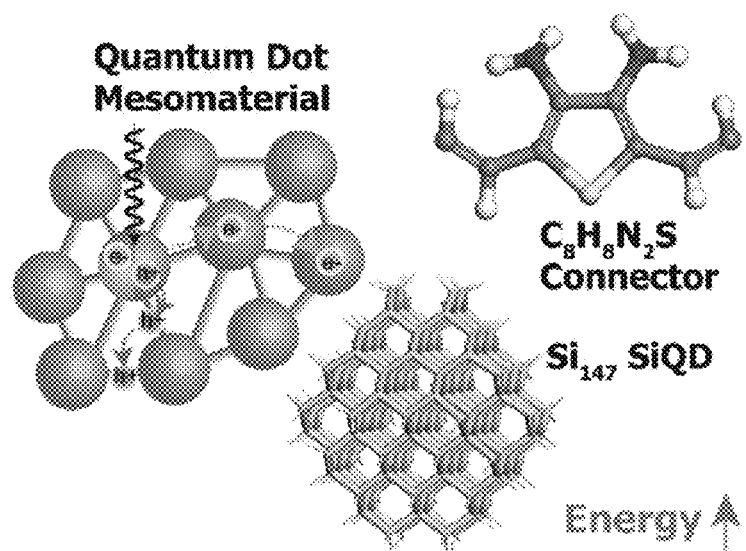
FIGS. 14(a) and 14(b) show an illustrative diagram of double superexchange.

These considerations have motivated the current proposal of a new Type-II paradigm in which covalent bonding between donors and acceptors allows for a much more controlled interfacial architecture. Specifically, an assembly of close-packed SiQDs are cross-linked by short ligands as illustrated in FIG. 14(a) so that a Type-II interface is established between the dots and their bridging units. This is important because it provides a means of overcoming the relatively high exciton binding energies of small SiQDs, allowing charges to separate. Excitons can be generated via photon absorption by the SiQD and/or molecules. Such chemical connections between donor and acceptor are thought to result in much faster charge separation for QDs within organic blends such as P3HT/CdSe and PbS/MEH-PPV. Since no exciton diffusion is required as in standard bulk heterojunction materials, charge separation will also benefit from state superposition resulting from Heisenberg uncertainty with respect to photon absorption. Because of the precise chemical bonding in such collections of dots and molecules, it seems appropriate to view them as quantum dot mesomaterials with emergent optoelectronic properties. The inventors focus on mesomaterials that do not exhibit translational symmetry which would otherwise introduce the possibility of band-like carrier transport behavior.

FIG. 14(a) shows a mesomaterial composed of SiQDs (blue) covalently bonded by short molecules (purple). The structures of the SiQD and the bridging molecule 2,5-divinylthiophene-3,4-diamine ($C_8H_8N_2S$) used in the inventors' prototype system are shown with the following atom coloring: Si (tan), H (white), C (grey), N (blue) and S (yellow). (b) Double superexchange mechanism: HOMO (red), LUMO (green), vibrational energy levels (black).

Figure 14B:
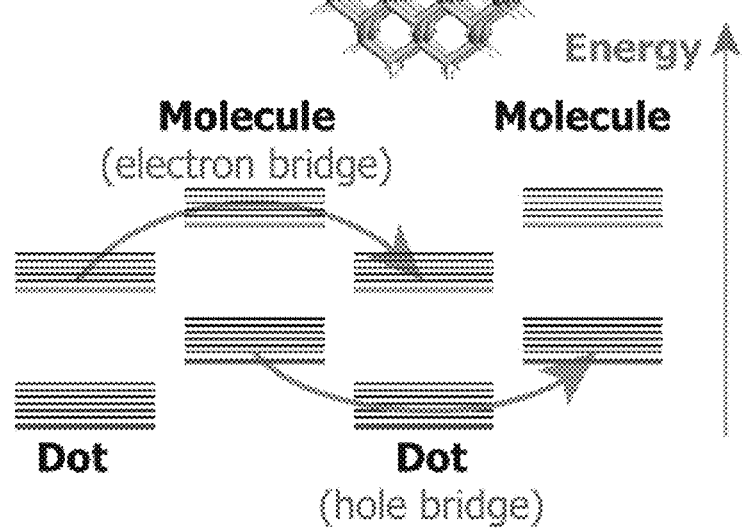

In the proposed system of interpenetrating networks, electron hopping is from dot to dot while the linking molecules transport holes. Such networks can be designed so that the rate of electron hopping is enhanced by the linking molecules even though no intermediate hop is made. The connecting moiety has energy levels that are not resonant with either the donor or acceptor, but it can still improve the electronic coupling of their respective orbitals. The electronic overlap between the dots is increased by establishing conjugated covalent bonds between the dots and the bridge (see FIG. 14(b)). Such a modification to the orbital overlaps is particularly important in covalent, bidentate bonding. The process is known as superexchange because of the configurational similarity to Kramers-Anderson superexchange, wherein strong magnetic coupling can exist between two cations that are separated by a nonmagnetic but mediating anion. Within the new paradigm, a further design step is taken though. Quantum dots adjacent to neighboring bridges are designed to improve the electronic overlap of states localized on the bridge molecules. The result is that hole hopping from bridge to bridge is also enhanced. The inventors refer to the combined electron and hole dynamics as double superexchange (DS), and this is illustrated in FIG. 14.

This new Type-II heterostructure is fundamentally distinct from recently considered networks of PbSe and CdSe dots. Such dots are initially terminated with long organic groups but can be made to undergo a ligand exchange reaction with small inorganic molecules. This allows them to be more closely packed. Although initially a matter of conjecture, new experimental analysis has confirmed that the resulting network is composed of dots that are covalently bonded to each other through bidentate ligands. This results in dramatically improved charge mobilities attributable to improved electronic overlap as explored in a recent computational investigation of CdSe QDs with bidentate $Sn_2S_6$ linkers.36 However, these are Type-I heterostructures and the ligands constitute a barrier to both electron and hole hopping between the dots. The inventors proposed architecture is also similar to that of small molecule solar cells, but is distinguished by its double superexchange property.

In order to demonstrate the DS paradigm, the inventors consider the charge dynamics of a model system based on 1.7 nm diameter SiQDs (Si147H100) bridged by 2,5-divinylthiophene-3,4-diamine ($C_8H_8N_2S$) molecule (see FIG. 14(a)). The photovoltaic efficiencies associated with this simple architecture are expected to be relatively low due to large energy gaps and interfacial energy losses, but the intent is only to establish that the new paradigm is viable. This is carried out via an ab initio analysis within the setting of phonon-assisted, nonadiabatic charge dynamics. The approach is used to estimate several key carrier rates: (1) charge transfer (CT) from localized excitonic states to a coulombically bound exciton at the interface between dot and molecule; (2) charge recombination (CR) wherein the bound exciton nonradiatively recombines to return the system to the ground state; (3) carrier hopping; and (4) photoluminescence (PL). Ground state properties and all vibrational data were calculated using Density Functional Theory (DFT) while quasi-particle and excitonic corrections were made for better optical property estimates.

The methodology is consistent with the inventors' earlier investigation of charge dynamics associated with a SiQD/P3HT interface. Specifically, the calculated CT rate ($4.0 \times 10^{12}$ $s^{-1}$) and PL rate of P3HT ($7.9 \times 10^8$ $s^{-1}$) reasonably reproduce the experimental values of $7 \times 10^{12}$ $s^{-1}$ and $1.5 \times 10^9$ $s^{-1}$, respectively. With the dangling bonds (DBs) accounted for, the calculated CR rate ($2.7 \times 10^{12}$ $s^{-1}$) and electron hopping (EH) rate ($1.3 \times 10^7$ $s^{-1}$) are in good agreement with the values of $1 \times 10^{12}$ $s^{-1}$ and $2 \times 10^7$ $s^{-1}$ observed experimentally. Furthermore, the inventors' computed PL rate of $1.8 \times 10^4$ $s^{-1}$ for the alkyl terminated 1.7 nm SiQD is consistent with the values obtained in two recent measurements ($1.7$-$5.0 \times 10^4$ $s^{-1}$ for 1-5 nm SiQDs and $1.3 \times 10^4$ $s^{-1}$ for 2.6 nm SiQD).

The computational analysis of the inventors' prototype SiQD mesomaterial indicates that the requisite Type-II energy level align-ment is formed at the dot/bridge interface with HOMO and LUMO localized on the molecule and dot, respectively (see FIG. 15(a)). A majority of absorbed photons would generate singlet excitons localized on the dot (3.2 eV) or on the molecule (3.6 eV) (FIG. 2(b)). Despite a large exciton binding energy (1.7 eV for the dot and 3.1 eV for the molecule), the exciton dissociation from either the dot or the molecule is still energetically favorable with an energy loss of 0.6 and 1.0 eV, respectively. In addition to the generation of an exciton on either the dot or molecule, a computed absorption spectrum indicates that direct photoexcitation of the charge transfer (CT) state is also possible.

FIG. 15(a) shows an illustrative HOMO (blue) and LUMO (red) of an Si147H100-$C_8H_8N_2S$ interface. The isosurface densities are 0.01° A. FIG. 15(b) shows energy levels of ground state (GS), local exciton state on the dot (LEdot), local exciton state on the $C_8H_8N_2S$ (LEbridge), charge transfer state (CT) for a coulombically bound electron-hole pair, and separated charge (SC) state for free carriers. Values indicating the span of black arrows are the energy difference between many-body states (eV), and red arrows denote the direction of exciton dissociation. FIG. 16 shows charge transfer, photoluminescence, charge recombination and carrier hopping rates at the dot/bridge interface. Blue and green arrows draw attention to competing rates.

The dot/bridge interface also supports rapid charge separation and transport dynamics for the efficient extraction of free carriers. As summarized in FIG. 16, charge separation rates for an exciton initially absorbed on either the dot or the bridge are much higher than the respective PL rates. This implies that the exciton should efficiently dissociate to a coulombically bound electron-hole pair, i.e. a polaron.

To be of practical use, of course, interfacial polarons must dissociate into free carriers. The associated Coulomb well, i.e. the energy difference between CT and SC states, can be as large as 0.31 eV (see FIG. 15(b)), and an electric field is required to promote efficient dissociation. However, an analysis based on the Onsager-Braun model indicates that the voltage drop across the cell during normal operation should provide the electric field required. The analysis is based on the assumption that polarons either dissociate to free carriers or decay to the ground state and requires that the internal voltage across the cell be specified. Provided that the internal voltage is larger than 0.2 V, a condition easily satisfied in the normal operation of photovoltaic cells with a reasonable fill factor, essentially all of the polarons will dissociate into free carriers (see FIG. 17).

FIG. 17 shows polaron dissociation probability at the Si147H100/$C_8H_8N_2S$ interface for a range of internal cell voltages (Vin). The red vertical line identifies the actual donor-acceptor distance in this model system. The lowest value of internal voltage (0.2 V) is deemed to be least value for which the Onsager-Braun model can be applied.

As indicated in the figure, relatively large fluctuations in donor-acceptor spacing would not change the separation efficacy. The Onsager-Braun analysis shows that polaron dissociation is this efficient as a result of both slow charge recombination from interfacial PL ($1.4 \times 10^5$ s$^{-1}$) and high electron and hole mobilities (0.15 and 1.5 cm$^2$ V$^{-1}$ s$^{-1}$ respectively). While slow charge recombination is attributable to the large energy drop of 2.6 eV from CT to GS (see FIG. 15(b)), the high carrier mobilities are a direct result of DS. Photon absorption on either dots or bridges will rapidly produce interfacial polarons which themselves dissociate into free charge carriers. As indicated in FIG. 16, the subsequent carrier hopping rates are much higher than both radiative and non-radiative interfacial charge recombination, a prerequisite for efficient carrier collection.

The DS mechanism can be elucidated by calculating carrier hopping rates without the mediating material between donor and acceptor. As summarized in Table 1, the presence of a single $C_8H_8N_2S$ between two dots increases the electron hopping rate between the dots by three orders of magnitude. This is expected to cause a similar enhancement in the electron mobility since the diffusion is nearly homogeneous.

In contrast, the hole hopping rates between $C_8H_8N_2S$ molecules strongly depend on the interface configurations. When the bridges form a parallel arrangement, the coupling between stacked p-orbitals is so strong that additional enhancement due to superexchange is negligible. However, superexchange is still crucial to the effective hole mobility because it facilitates rapid hole hopping at the corner and ridge positions of the dots (see FIG. 18). This superexchange enhancement of the hole hopping rate can be as large as four orders of magnitude even though is derived from only a modest spreading of donor and acceptor HOMOs to the mediating dot (see FIG. 18). In fact, it is this large change in electronic coupling, in association with a comparatively small change in orbital overlap, which is the hallmark of superexchange. For hole hopping between bridge molecules that do not exhibit p-bonding, superexchange can enhance the rate by orders of magnitude even when the molecules are closely spaced and parallel, e.g. benzenedithiol.

Control experiments involving three additional connector molecules provides a deeper understanding of bridge assisted carrier hopping. The inventors compared the transport dynamics associated with $C_{10}H_{10}O_2S$, $C_8H_6S$, and $C_6H_4S_2$ bridges. The electronic coupling induced by $C_8H_6S$ and C10H10O2S is 1.5 and 1.9 times that of $C_8H_8N_2S$. These factors correlate with reductions in the LUMO offsets, consistent with the notion that bridge molecules with LUMO energy levels closer to those of the dots result in higher electron hopping rates. In contrast, $C_6H_4S_2$ has a larger LUMO offset than $C_8H_6S$ and has an electronic coupling that is reduced by a factor of 0.35.

Interestingly, this is the case even though the dot separation has been reduced from 21.9 to 21.1° A. This is reasonable since superexchange is dominated by the state coherence between donor, acceptor and bridge, and closer energy levels would lead to strengthened electronic coupling. The DS rate enhancement is even more dramatic when the dots are connected by multiple $C_8H_8N_2S$ molecules, an architecture that would most likely be realized in reality. Two $C_8H_8N_2S$ bidentate molecules gives an enhancement of electron mobility compared to no bridge that is approximately twice that with one $C_8H_8N_2S$ (8.4×104). The hole superexchange is small in this parallel configuration of bridges, but it is much larger when the bridging molecules are not parallel as occurs on dot edges and corners. While the concept of double superexchange is new and necessarily involves interpenetrating electron and hole trans-port networks, the inventors have identified a number of systems in which single superexchange may already play a role in quantum dot assemblies. For instance, the high carrier mobilities associated with cross-linked QD assemblies may be a signature of superexchange. Along these same lines, the enhanced mobility of $5.1 \times 10^7$ cm$^2$ V$^{-1}$ s$^{-1}$ has been reported for PbS QD films treated with 3-mercaptopropionic acid (MPA), which may be due to superexchange. In support of the feasibility of creating interpenetrating networks of charge carriers, there are a number of recent works in which this has been shown to be possible.

In summary, the inventors propose a new Type-II assembly of quantum dots connected via covalently bonded, short-bridge molecules. The functionalization scheme envisioned amounts to the construction of a quantum dot mesomaterial. While challenging to generate, the architecture amounts to an extension of recent developments in solution processing techniques. A proper choice of dot and molecular connector results in rapid exciton separations relative to competing recombination rates. The inventors' first-principles calculations of a model system indicate that both polaron dissociation and subsequent carrier hopping are significantly enhanced by a double superexchange mechanism due to enhanced electronic coupling of both carrier types. In addition, no exciton diffusion is required and excitonic superpositions required by Heisenberg uncertainty offer an initially well-distributed exciton distribution. Because SiQD mesomaterials have been considered in this disclosure, double superexchange dynamics may be designed into other material systems as well because the underlying superexchange mechanism is ubiquitous in both artificial and natural systems.

Additional Illustrative Embodiments

The absorption of photons through direct generation of spatially separated excitons at dot-ligand interfaces is demonstrated, by ab initio calculations, to be a promising strategy for tailoring the optical gap of small silicon quantum dots independent of their size. For solar energy applications, the strategy can be used to align dot absorption with the peak of the solar spectrum. The key is to establish a Type-II energy level alignment and a strong electronic coupling between the dot and ligand. The inventors' analysis indicates that that connecting conjugated organic ligands to SiQDs using vinyl connectivity can satisfy both requirements. This allows the composite optical gap to tailored independent of dot size. For a prototype assembly of 2.6 nm SiQDs, the inventors predict that triphenylamine (TPA) termination will result in a 0.47 eV redshift along with an enhanced near-edge absorption character. Robustness analyses of the influence of oxidation on absorption and of extra alkyl ligands reveal that the control of both factors is important in practical applications. The inventors also propose a technique for determining the surface configuration as a means of better comparing predictions with experimental measurements.

Colloidal semiconductor quantum dots (QDs) have received significant attention for applications in light emission, photovoltaics, and biomedical imaging, sensing and treatments because of their unique properties. These include tunable absorption and emission spectra, solution processability, multiple exciton generation, and slow cooling rate of hot carriers. Most of the QDs currently explored, though, are based on metal chalcogenide semiconductors that use toxic elements such as cadmium and/or lead, which is a severe drawback for the applications described above. In contrast, recent achievements in the synthesis, processing and purification of environmentally benign silicon-based quantum dots (SiQDs) make their use much more promising going forward.

However, there are challenges associated with a silicon-based paradigm as well: dangling bond defects tend have a deleterious effect on the optical performance of silicon quantum dots (SiQDs); the dots tend to agglomerate in solution; assemblies of SiQDs have extremely poor carrier mobility; and dot designs must contend with the fact that the band edge absorption of bulk silicon is low because of its indirect character. Within the setting of solar energy harvesting, SiQD-based photovoltaic (PV) devices that have been created as hybrid SiQD/organic polymer blends and SiQD/bulk heterojunction tandem solar cells have efficiencies that are quite low.

Some of these issues can be addressed by focusing on small SiQDs. Dangling bond defects can be essentially eliminated by making the dots sufficiently small, and the absorption cross-section of sufficiently small dots is dramatically enhanced via a pseudo-direct optical transition. These call for SiQDs on the order of 1-4 nm. This size regime has other advantages as well. SiQDs of this size transport excitons more efficiently resist oxidation better, use their slice of the solar spectrum more efficiently, show greater promise in multiple-exciton generation and hot carrier collection paradigms, and have a higher excitonic coupling for the same surface-to-surface separation.

Unfortunately, SiQDs of this size have optical gaps in the range of 2-3 eV (600-400 nm); poorly matched to the solar spectrum and missing the important low-optical and IR regions for light emission applications. In addition, the associated exciton binding energies are too high to result in room temperature dissociation of charge carriers for photoelectric applications. Because of their high surface-to-volume ratio, though, it may be possible to functionalize their surfaces so as to remedy these drawbacks. Surface functionalization might also be used to improve carrier mobility and processability.

To date, organic functionalization of SiQDs has been largely limited to alkyl chains8 that help with solubility and protection against oxidation. One possible strategy is to directly generate spatially separated excitons at the Type-II interface between the core of the dot and its surface ligands (see FIG. 19).

FIG. 19 shows schematics of (a) traditional passivation schemes with a Type-I energy level alignment between the dot and the ligand, and a Si—C—C connection; and (b) the inventors' scheme with a Type-II interface and a Si—C=C conjugating connection. The blue and pink solid lines indicate the HOMO and the LUMO localization, respectively. The corresponding energy level alignment in each case is illustrated in the middle of each panel, and the green arrows notify the transitions associated with the low-energy absorption. For each situation, the absorption spectrum is scratched on the right to illustrate the match to the solar spectrum.

As long as the coupling between the core and the terminating shell is sufficiently large, photons with energies much lower than the intrinsic band gaps of both the dot and the ligand can be absorbed to excite electrons from the HOMO (localized on the ligands) to the LUMO (localized on the dot). In fact, this concept has been successfully applied to the core shell nanocrystals. In that setting, Type-II architectures exhibit new absorption features in the range below the core energy gap as well as much lower charge recombination rates compared to their Type-I counterparts.

Reproducing such schemes on SiQD assemblies remains a challenge, and none of the existing functionalization schemes are able to provide substantial absorption below 3 eV, even though the passivation schemes have been studied exhaustively. Only recently has substantial redshift of absorption and emission spectra been achieved, but the observed redshift may originate from the creation of new surface states, the change of dot energy levels due to surface treatment, and the transition between ligand and dot orbitals. This motivated Atkins et al. to carry out a femtosecond transient absorption experiment in which the aminopropenyl-terminated SiQDs show photoexcited carrier dynamics between the QDs and ligand, which is strong evidence for the existence of the charge transfer states. However, their SiQDs were synthesized in aqueous solution, and even mild oxidation would change the localization of the wave function causing a noticeable redshift of the spectra. Furthermore, it is not clear how the aqueous solvents with high dielectric constants contribute to the distinct characteristics of SiQDs with various passivations.

The traditional alkyl termination of SiQDs, 35 intended to mitigate oxidation, results in a Type-I energy level alignment between the dot and the ligand with a large band offset, wherein both the HOMO and the LUMO are localized inside the core of the dot. Photon energies of 3 eV are then required to produce excitons in the smallest SiQDs. A number of other functionalizations have been explored, though, such as diols and epoxides, amineterminated alkyls, and conjugating vinyl (Si—C=C) connections.19,28,37 The resulting mixing of dot and ligand orbitals can induce a substantial increase in the oscillator strength and, in special cases where the mixing is serendipitously strong, can result in a lower of the absorption gap. In general, though, the Type-I energy level alignment still sets the lower bound of the optical gap which is close to that of the hydrogen-passivated dot.

On the other hand, spatially separated excitons at Type-II interfaces can be used to tailor optical gap, now based on the HOMO of the ligand and the LUMO of the dot. The SiQD absorption edge can therefore be adjusted by choosing ligands with different HOMO levels. Distinct from the well-known quantum confinement effect, this scheme provides an alternative way to tune the optical spectrum of a SiQD which could be especially valuable in building tandem solar cells. Functional groups that result in a Type-II energy alignment are not sufficient by themselves though. They must also result in large magnitudes of optical transition matrix elements between the unoccupied orbitals localized on the dot and the occupied orbitals localized on the ligand, and this endows the system with a high absorption cross section. Such a passivation scheme shows great promise not only for a much better match between the solar spectrum and the absorption spectra of small SiQD assemblies, but also for a boost of intensity near the absorption edge.

To clarify the origin of the redshift and to help design passivation schemes to facilitate better absorption, ab initio simulations have been applied to SiQDs with various terminations. Consistent with experiments, their results suggested that alkene and alkyne chains barely change the gap of the dot but a low-level oxidation could cause noticeable redshift in spectra. Interestingly, the highest occupied (HOMO) and the lowest unoccupied molecular orbitals (LUMO) of a passivated SiQD can be localized on the ligand and dot, respectively, for dots with diameters of 1.5 nm. While these model systems indicate that it is possible to reduce the optical gap, it is still unclear whether such spatially separated excitons would be able to assist the light harvest in practical systems because the associated oscillator strength of the optical transition is normally very small. In addition, the effect of the ligand is certain to change with increasing dot size, and the oxidation, inevitable in reality, may have a deleterious effect on low-energy absorption.

This has motivated the inventors' computational investigation to design a practical passivation strategy for SiQD assemblies that are promising for improving optical absorption and largescale manufacturing. The inventors demonstrate that two conditions need be satisfied to efficiently harvest light by spatially separated exciton: (1) a Type-II energy level alignment, and (2) conjugating vinyl bond (Si—C=C) connection between ligands and QiQDs.

A hydrogen passivated, 1.7 nm diameter SiQD (Si147H100) was analyzed under five conditions in order to elucidate the inventors' basic design premise. First the absorption spectrum was calculated with the original dot, and then it was subjected to functionalization with two types of molecules. As shown in FIG. 20, 1-butene (C4H8) has a Type-I energy level alignment relative to the dot, while triphenylamine (TPA) offers a Type-II alignment. Each molecule type can be attached with either C—C or C=C connectivity, and absorption data was generated for each of these four possibilities. A Type-I interface with the Si—C=C connections (see FIG. 20(e)) only slightly increases the absorption in the high-energy range and has negligible influence in the low-energy range (see FIG. 20(a)). In contrast, when a Type-II energy level alignment is formed with the Si—C—C connectivity, additional absorption peaks emerge inside the optical gap of the dot but their intensities are very low due to the small overlap between the HOMO and the LUMO wave functions (see FIG. 20(d)). Strong absorption in the low energy range occurs only when a Type-II interface is formed with the Si—C=C connections (see FIG. 20(c)). Both design rules need to be enforced. FIG. 20(b) shows a structure of the TPA molecule.

Figure 21A:
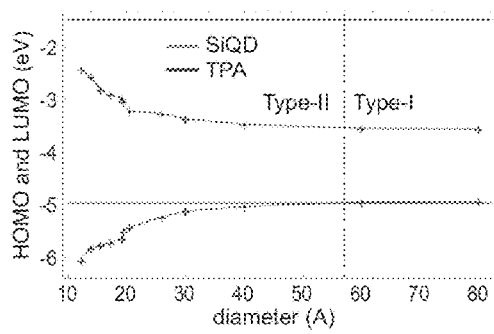
FIGS. 21(a)-(f) shows illustrative energy level alignments.
Figure 21D:
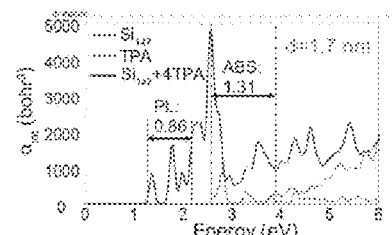
Figure 21E:
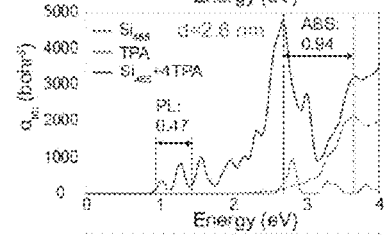
Figure 21F:
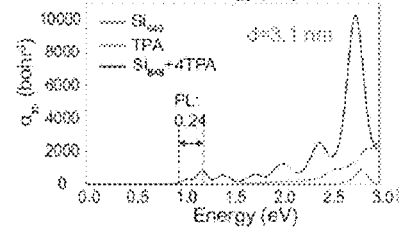
Figures 21B, 21C:
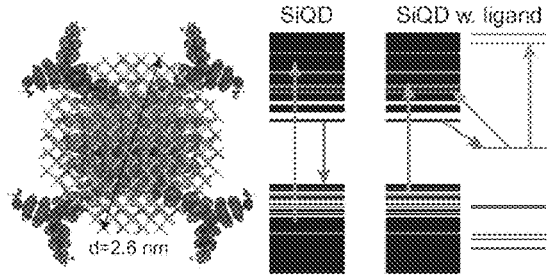

Optical properties were next considered as a function of dot diameter, d, with TPA functionalization. FIG. 21(a) shows energy level alignment between SiQDs of different sizes and TPA in dichloromethane solvent (=9.08). The dashed green line denotes the transition from a Type-II to a Type-I interface. FIG. 21(b) shows HOMO (blue) and LUMO (purple) of Si465 capped by four TPA ligands. The values of the isosurfaces are 0.009 Å-3/2. FIG. 21(c) shows an illustration of absorption processes (upward blue arrows) and emission (downward red arrows) on the H-passivated dots and TPA-functionalized dots. Comparison of the influences of TPA ligand on absorption spectra of SiQD with different sizes are shown from FIG. 21(d) to FIG. 21(f). The predicted redshift of PL and absorption (ABS) peaks are shown in unit of eV.

As quantified in FIG. 21(a), the transition from Type-II to Type-I alignment occurs at d=5.5 nm, so TPA is a good prototypical functionalizer for this study. Moreover, calculated absorption spectra of TPA-treated SiQDs shows a strong absorption cross section for d=1.7, 2.6 and 3.1 nm as summarized in FIG. 21(d)(e)(f). Although the redshift decreases with increasing dot size, the absorption intensity near the absorption edge is still significantly enhanced even for the largest dots.

The 2.6 nm SiQDs are in the middle of the range studied and also of a size that can currently be easily synthesized. Functionalization of them with four TPA ligands resulted in a 0.47 eV redshift of the optical gap (based on the PL peak), and a 0.94 eV redshift of the first strong absorption peak (see FIG. 21(e)). The analysis shows that, while the peaks below 2 eV should be ascribed to the excitation from the HOMO of the TPA to a range of unoccupied orbitals of the dot, the peaks above 2 eV have three contributions: the spatially separated exciton, the intensified transition from deep occupied to unoccupied levels of the dot, and the excitation on the ligand itself (see FIG. 21(b)(c)).

Additional analysis of these 2.6 nm dots indicates that the absorption spectrum is not sensitive to the position and orientation of the TPAs and that the absorption strength peak increases with TPA coverage.

The calculated PL rates were found to increase remarkably with TPA functionalization regardless for all dot sizes considered (Table 1). Although these rates are almost certainly underestimated due to the neglect of the phonon-assistance, 47 the trend is expected to be reasonable because of the large oscillator strength associated with the spatially separated exciton. Fortunately, such comparatively rapid PL will not affect energy conversion since it is still much slower than the subsequent charge separation and transport in the presence of a Type-II interface. Indeed, consistent with experiment, 9 the inventors' calculated charge separation rate is as high as 4.0–1012 s-1 in assemblies of perfect H-capped SiQDs blended with P3HT, only slightly decreasing to 2.3–1012 s-1 in case of the TPA functionalization.

Table 1 shows PL lifetimes (seconds) of H-passivated and 4-TPA-functionalized Si147, Si465 and Si849.

TABLE 1

|  | without TPA | with TPA |
|---|---|---|
| $Si_{147}H_{100}$ | $1.2 \times 10^{-4}$ | $6.5 \times 10^{-6}$ |
| $Si_{465}$ | $1.1 \times 10^{-3}$ | $4.0 \times 10^{-5}$ |
| $Si_{849}$ | $2.3 \times 10^{-3}$ | $1.4 \times 10^{-4}$ |

The above results suggest that in principle the TPA-capped SiQDs should significantly redshift optical absorption while also improving absorption cross section. To be useful in practice, though, these properties must be robust in the face of inevitable oxidation is inevitable and the introduction of other types of ligands often added to give the dots improved processability.

FIG. 22(a) shows HOMO (in blue) and LUMO (purple) wave function of Si465 with 41% oxidized surface backbonds, and with 4 TPA ligands as well as 41% oxidized surface backbonds. The values of the isosurfaces are 0.009 Å-3/2. FIG. 22(b) shows the optical gaps of H-passivated Si465 and 4-TPA-passivated Si465 with various degree of surface backbond oxidation from 0% to 74%. FIG. 22(c) shows an absorption spectra of TPA capped Si465 with different O density. FIG. 22(d) shows an absorption spectra of TPA capped Si465 with 41% backbond oxidation compared to that without the TPA and that without the oxygen.

The effect of oxidation was quantified by gradually increasing the coverage of oxidized backbonds from 0% to 74% at the outmost shell of Si465 both with and without four TPA ligands (see FIG. 22(a)). As shown in FIG. 22(b), without TPA, the optical gap of the dot tends to decrease with increasing oxygen (O) density, consistent with previous calculations. The fluctuations shown are due to a sensitivity to insertion sites. In contrast, the optical gap of TPA-capped dots at first goes down with increasing O density, dropping by as much as 0.3 eV, and then increases back to and even slightly above that of the unoxidized dots. This is because, regardless of the O level, the HOMO and LUMO are localized on the dot without TPA while they become localized on the TPA and dot separately when that ligand is added (see FIG. 22(a)). Without TPA, the HOMO spreads to the dot surface while the LUMO first expands and then shrinks into the core with increasing oxidation. With TPA, though, the HOMO and LUMO do not change significantly until two-thirds of backbones are oxidized.

Oxidation modifies not only the optical gap of the TPA-capped SiQD (up to 0.3 eV for the Si465 dot) but also the absorption spectrum. FIG. 22(c) shows that absorption intensity first increases until about 40% oxidation and then decreases with further severity of oxidation. When less than 40% surface backbonds are oxidized, the absorption of the TPA-capped SiQDs are much stronger than that of the dots without TPA, and that of the oxidized dots are much stronger than that of the oxygen-free dots, as demonstrated in 22(d). However, if the oxidation coverage is above 65%, the contribution of spatially separated exciton to the absorption will be mostly quenched. Such tolerance of the optical properties to oxidation should allow experimental verification of the efficacy of TPA functionalization under realistic laboratory environments.

Another type of contamination is alkyl chains, which are typically added to improve the solubility of dots. It has been reported that these ligands cause very little change in optical properties of the dot (near the absorption/emission edges) irrespective of chain length and ligand density, although HOMO and LUMO levels of the capped dots are shifted upward significantly. For the TPA-capped dots, though, the alkyl chains could change the absorption near edge more significantly because the gap of the spatially separated exciton relies on the LUMO of the dot and the HOMO of the TPA, and the latter is nearly fixed. The inventors calculations suggest that, with 50% of the surface covered with methyl, the increase of the near-edge absorption intensity relative to that of H-terminated dots is preserved. However, a reduction in the optical gap attributed to the TPA ligand is totally offset by the increase of the LUMO level due to the presence of methyl. Because of this, the alkyl termination should be minimized or replaced by other functional groups.

An ab initio analysis has demonstrated that the functionalization of SiQDs with organic ligands can be used to significantly reduce their optical absorption gap. This has the potential to solve an long-running problem associated with small SiQDs: that their optical gaps are too high for many technological applications. The strategy is based on a simple two-part design to ensure that a: (1) Type-II energy level alignment exists between the dots and its functionalizing ligand; and (2) conjugating vinyl bond connectivity is created between the dot and ligand to enhance the oscillation strength of the optical transition. In concert with the traditional method of tuning optical gap by degree of quantum confinement, the new strategy allows an additional degree of design freedom to exploit the novel properties of small SiQDs without settling for a large optical gap.

While strong absorption has been previously achieved by Type-II core-shell quantum dots, it is difficult to move carriers localized inside the cores to the electrodes. As a result, such core-shell dots are not currently useful in applications where carrier transport is essential. The proposed passivation scheme could solve this problem, because the sparse ligand layer allows dots to be connected using bridging molecules so as to enhance the electron coupling between the dots. Experimental data was established for a prototype system consisting of a 2.6 nm SiQD functionalized by TPA ligands. The result was a 0.47 eV redshift in optical gap along with a substantial enhancement of the absorption intensity near the edge.

As will be appreciated, it would be possible to provide for some features of the inventions without providing others.

One of ordinary skill in the art will appreciate that embodiments of the present disclosure as provided in figures herewith may be used in applications other than the illustrative embodiments presently disclosed.

What is claimed is:

1. A semiconductor material, comprising:
a silicon-based quantum dot; and
a conjugated organic ligand connected to the silicon-based quantum dot to obtain a functionalized quantum dot, wherein the connection between the conjugated organic ligand and the silicon-based quantum dot is a Type-II interface.

2. The semiconductor material of claim 1, wherein the functionalized quantum dot has an organic bridge between the silicon-based quantum dot and the conjugated organic ligand, and wherein a highest occupied molecular orbital and a lowest unoccupied molecular orbital that are distributed in both the organic bridge and the silicon-based quantum dot.

3. The semiconductor material of claim 1, wherein the Type-II interface has a conjugated vinyl connectivity.

4. The semiconductor material of claim 1, wherein the Type-II interface reduces an optical gap of the silicon-based quantum dot.

5. The semiconductor material of claim 1, wherein the Type-II interface has covalent bonding.

6. The semiconductor material of claim 5, wherein the covalent bonding is through bidentate ligands.

7. The semiconductor material of claim 1, wherein the conjugated organic ligand is a phenylimide surface ligand.

8. The semiconductor material of claim 1, wherein the connection is a Si—C=C conjugating connection.

9. The semiconductor material of claim 1, wherein the connection is a Si-vinyl-aromatic ligand connection.

10. The semiconductor material of claim 1, wherein the functionalized quantum dot has a photoluminescent red shift of greater than or equal to about 20 nm.

11. The semiconductor material of claim 1, wherein the Type-II interface has highest occupied molecular orbital localized on the conjugated organic ligand and a lowest unoccupied molecular orbital localized on the silicon-based quantum dot.

12. The semiconductor material of claim 1, wherein the conjugated organic ligand is a 4-vinyl-N,N-bis(4-methoxyphenyl)aniline.

13. A quantum dot, comprising:
   a silicon-based quantum dot; and
   a conjugated organic ligand connected to the silicon-based quantum dot to obtain a functionalized quantum dot, wherein the connection between the conjugated organic ligand and the silicon-based quantum dot is a Type-II interface.

14. The quantum dot of claim 13, wherein the functionalized quantum dot has an organic bridge between the silicon-based quantum dot and the conjugated organic ligand, and wherein a highest occupied molecular orbital and a lowest unoccupied molecular orbital that are distributed in both the organic bridge and the silicon-based quantum dot.

15. The quantum dot of claim 13, wherein the Type-II interface has a conjugated vinyl connectivity.

16. The quantum dot of claim 13, wherein the Type-II interface reduces an optical gap of the quantum dot.

17. A method of making a semiconductor material, comprising:
   providing a silicon-based quantum dot; and
   connecting a conjugated organic ligand to the silicon-based quantum dot to obtain a functionalized quantum dot, wherein the connection between the conjugated organic ligand and the silicon-based quantum dot is a Type-II interface.

18. The method of claim 17, wherein the functionalized quantum dot has an organic bridge between the silicon-based quantum dot and the conjugated organic ligand, and wherein a highest occupied molecular orbital and a lowest unoccupied molecular orbital that are distributed in both the organic bridge and the silicon-based quantum dot.

19. The method of claim 17, wherein the Type-II interface has a conjugated vinyl connectivity.

20. The method of claim 17, wherein the Type-II interface reduces an optical gap of the silicon-based quantum dot.

\* \* \* \* \*

UNITED STATES PATENT AND TRADEMARK OFFICE
CERTIFICATE OF CORRECTION

PATENT NO. : 9,837,624 B2
APPLICATION NO. : 14/639868
DATED : December 5, 2017
INVENTOR(S) : Alan Sellinger et al.

Page 1 of 1

It is certified that error appears in the above-identified patent and that said Letters Patent is hereby corrected as shown below:

In the Specification

Column 1, Line 16:
After the CROSS REFERENCE TO RELATED APPLICATIONS section and before the FIELD OF THE INVENTION section insert:
--GOVERNMENT LICENSE RIGHTS
This invention was made with government support under grant CNS-0722415 awarded by the National Science Foundation. The government has certain rights in the invention.--

Signed and Sealed this
Fourth Day of September, 2018

Andrei Iancu
*Director of the United States Patent and Trademark Office*